United States Patent
Kumamoto

(10) Patent No.: US 8,289,126 B2
(45) Date of Patent: Oct. 16, 2012

(54) RESISTIVE ELEMENT AND MANUFACTURING METHOD THEREFOR

(75) Inventor: Keita Kumamoto, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/277,717

(22) Filed: Oct. 20, 2011

(65) Prior Publication Data

US 2012/0098635 A1    Apr. 26, 2012

(30) Foreign Application Priority Data

Oct. 26, 2010    (JP) .................................. 2010-239869

(51) Int. Cl.
   *H01C 1/012* (2006.01)
(52) U.S. Cl. ....... 338/308; 338/252; 338/312; 29/610.1; 438/595; 438/725
(58) Field of Classification Search .................. 338/226, 338/252, 312
   See application file for complete search history.

(56) References Cited

U.S. PATENT DOCUMENTS

| | | | | |
|---|---|---|---|---|
| 4,777,718 A | * | 10/1988 | Henderson et al. | 29/620 |
| 6,255,152 B1 | * | 7/2001 | Chen | 438/199 |
| 6,387,760 B2 | * | 5/2002 | Takahashi et al. | 438/284 |
| 7,553,732 B1 | * | 6/2009 | Brown et al. | 438/300 |
| 7,807,557 B2 | * | 10/2010 | Yoshida et al. | 438/591 |
| 2005/0153566 A1 | * | 7/2005 | Han et al. | 438/725 |

FOREIGN PATENT DOCUMENTS

JP    2007-165622    6/2007

* cited by examiner

*Primary Examiner* — Kyung Lee
(74) *Attorney, Agent, or Firm* — Young & Thompson

(57) ABSTRACT

A higher precision resistive element suppresses variation of the resistance value due to variation of film thickness. A resistive element includes a first portion having a first film thickness and a first width, and a second portion having the first film thickness and a second width determined by the first width. The sum of the first and second widths is constant. The first portion has an upper surface at a position at which a height from the bottom surface of the resistive element first portion is a first height. The resistive element second portion has an upper surface of the resistive element second portion at a position at which a height from a surface including the bottom surface of the resistive element first portion is the first height. The resistive element first portion and the resistive element second portion are coupled to each other via a coupling portion.

20 Claims, 34 Drawing Sheets

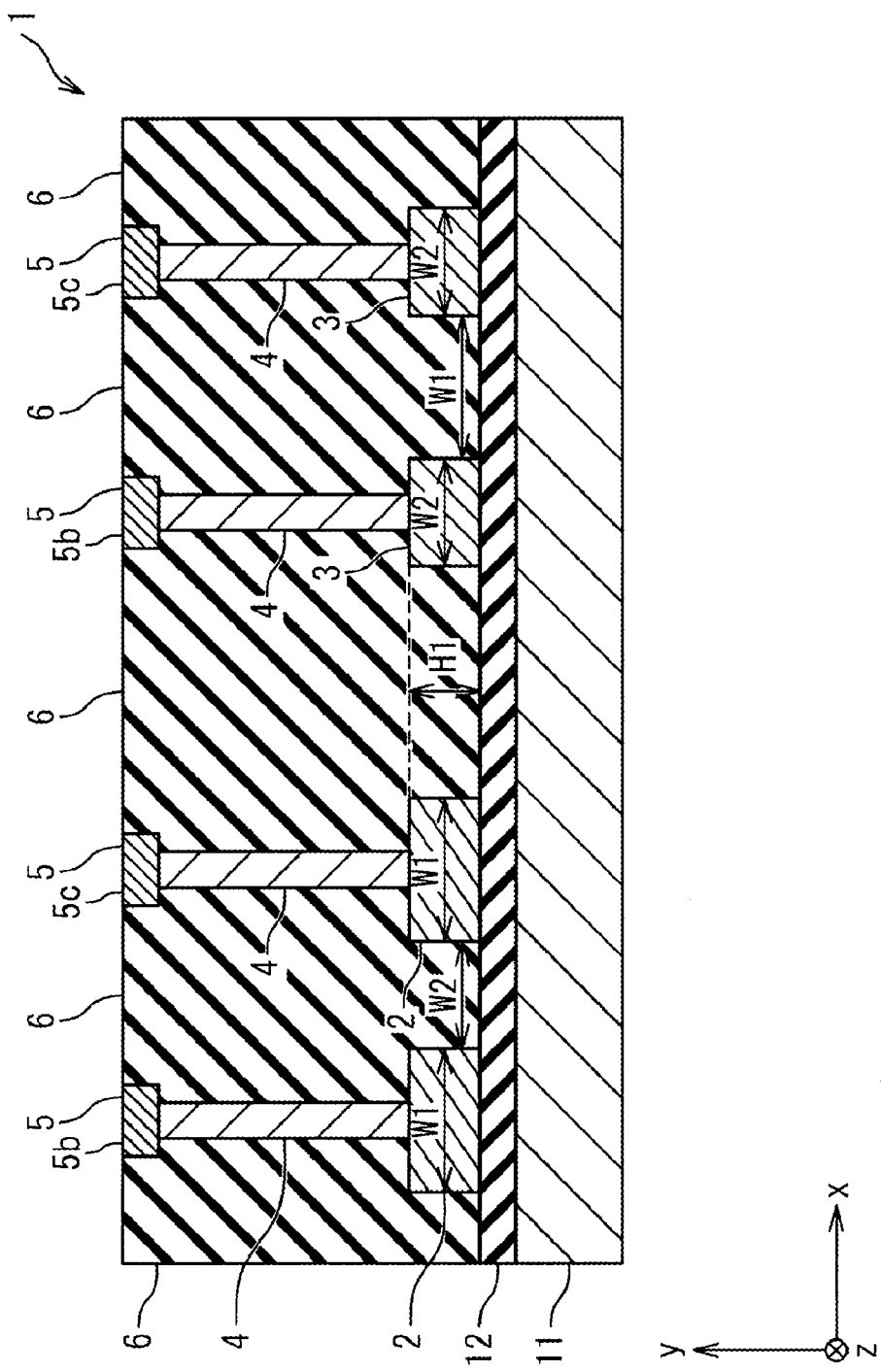

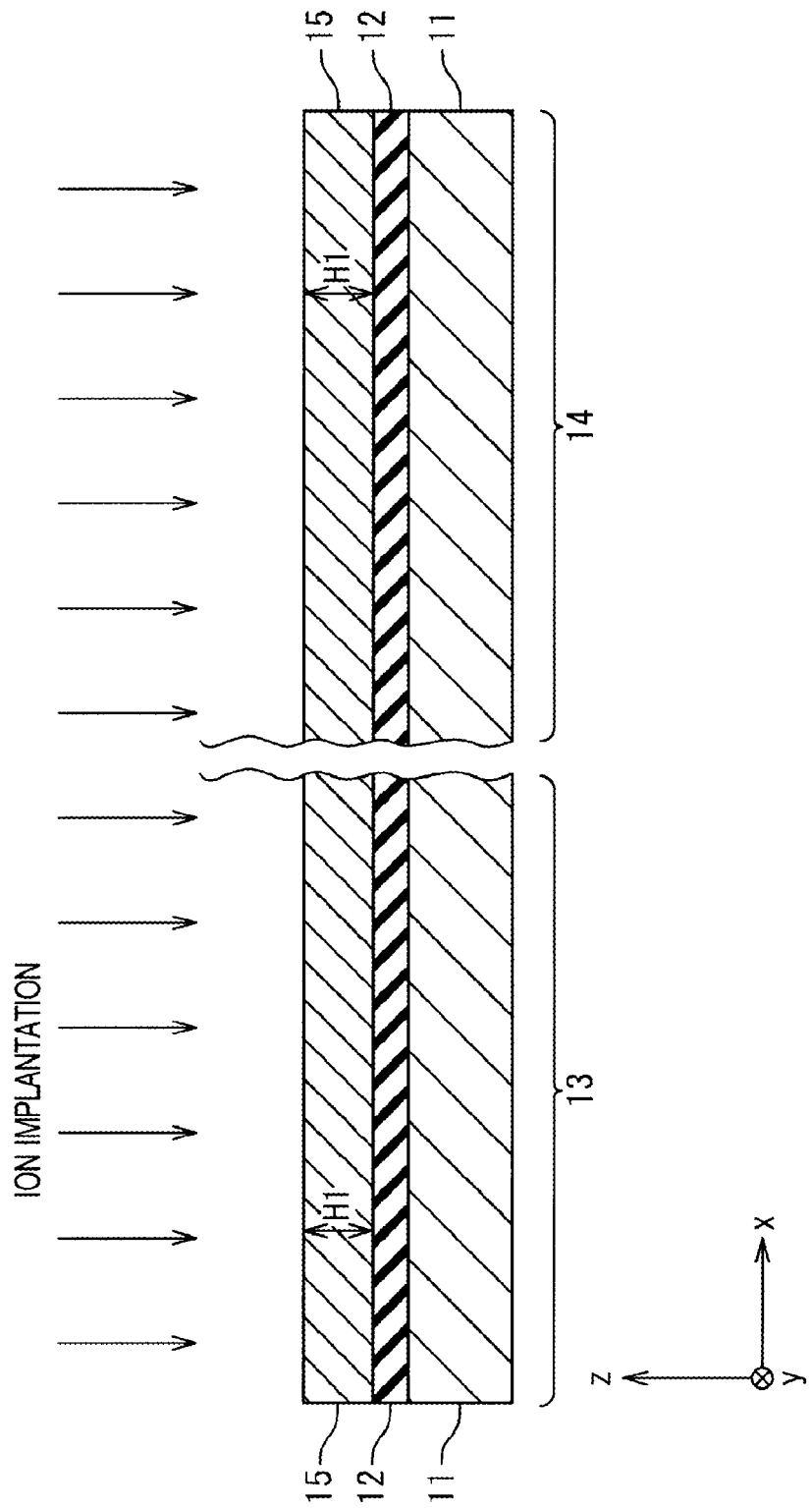

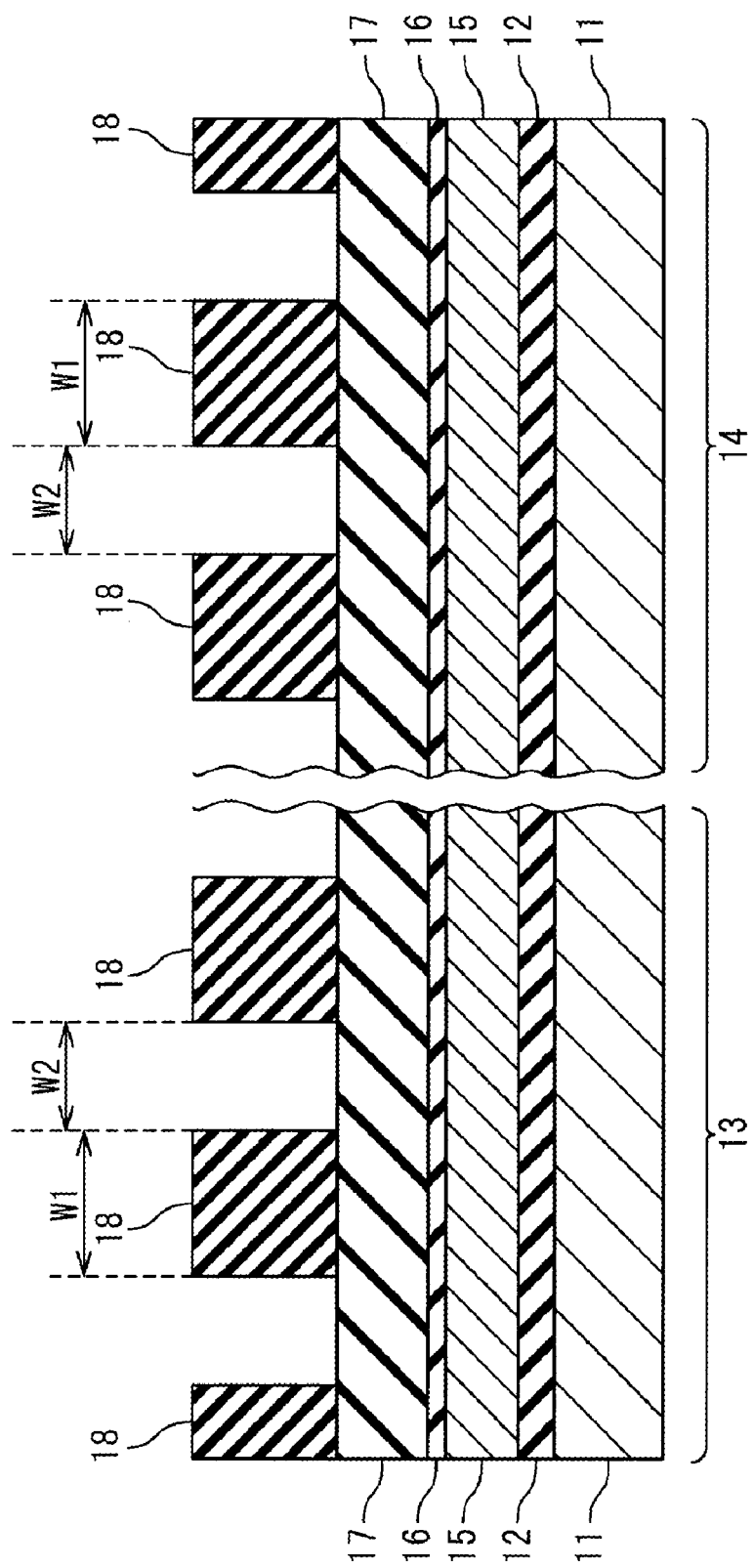

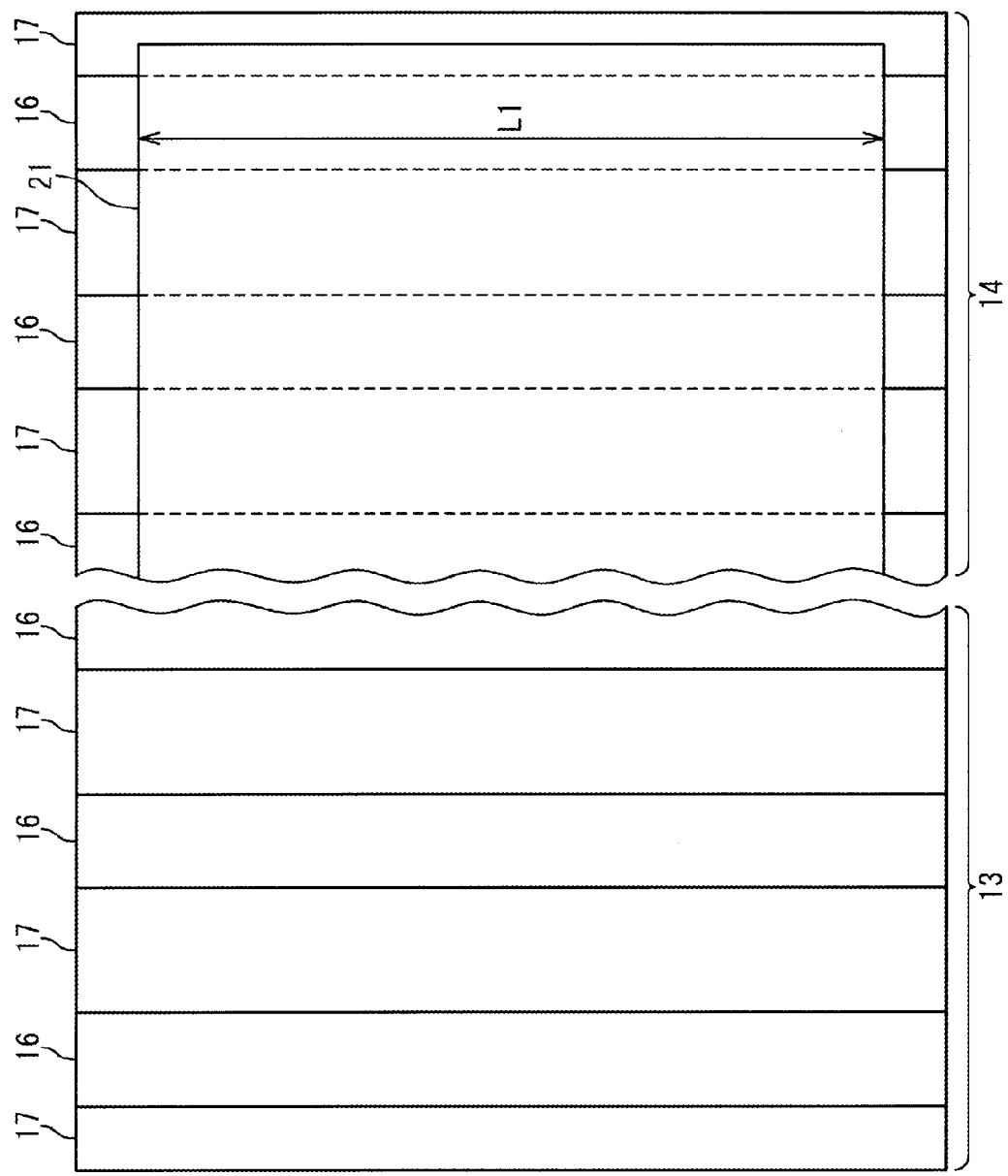

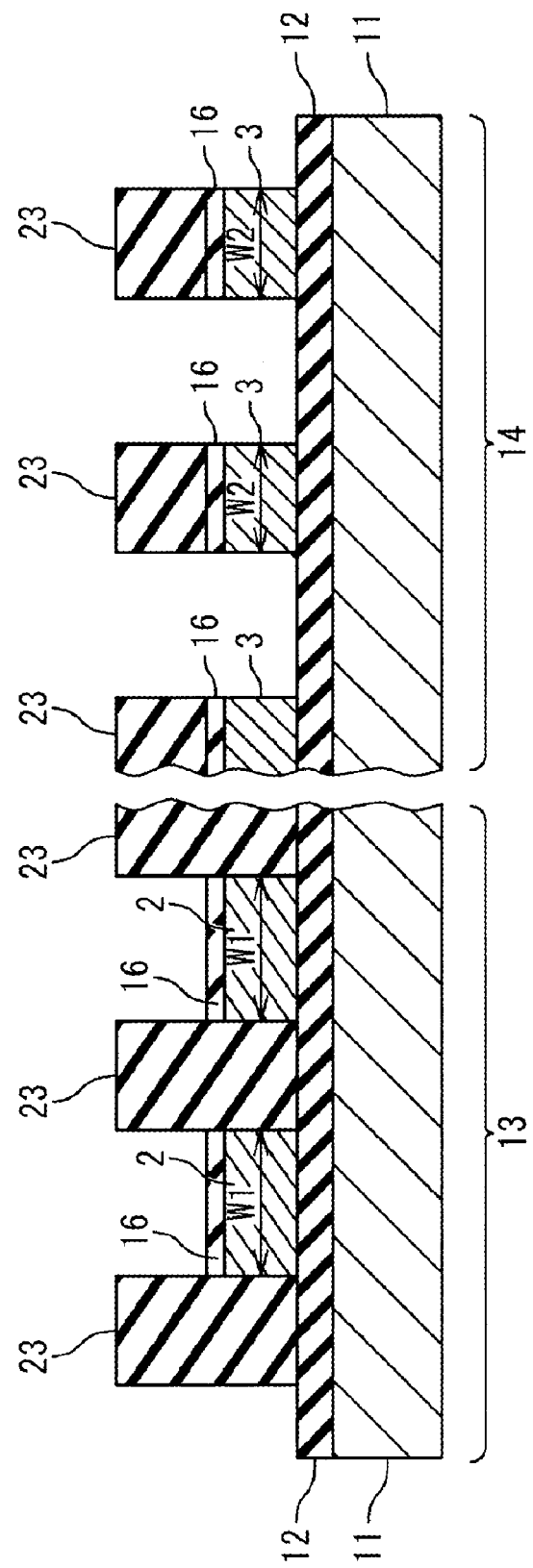

RESISTIVE ELEMENT AND MANUFACTURING METHOD THEREFOR

CROSS-REFERENCES TO RELATED APPLICATIONS

The disclosure of Japanese Patent Application No. 2010-239869 filed on Oct. 26, 2010 including the specification, drawings and abstract is incorporated herein by reference in its entirety.

BACKGROUND

The present invention relates to a resistive element and a method of manufacturing the same, and more particularly to a resistive element that can be applied to a high-precision analog circuit and a method of manufacturing the same.

As semiconductor devices are required to be more precise, high-precision semiconductor elements are required. For example, a semiconductor device in which a power supply circuit, a high-precision analog circuit, and the like are mounted includes multiple resistive elements. A technique for suppressing variation of resistance values of the resistive elements is required. A resistive element used in a semiconductor device is formed by patterning a polycrystalline silicon film formed over an insulating film into a shape of resistive element.

The resistive element is formed through a manufacturing process such as exposure and etching of the polycrystalline silicon film. Size variation generated when the polycrystalline silicon film is formed may be a factor of the variation of resistance values of the resistive elements formed through the manufacturing process. A technique for suppressing the variation of resistance values due to the size variation generated in the manufacturing process such as exposure and etching is known (for example, see Japanese Unexamined Patent Application Publication No. 2007-165622).

FIGS. 1A and 1B are diagrams showing a configuration of a resistive element 117 described in Japanese Unexamined Patent Application Publication No. 2007-165622. FIG. 1A is a plan view showing a plane surface of the resistive element 117, and FIG. 1B is a cross-sectional view showing a cross-section of the resistive element 117 taken along line A-A in FIG. 1A.

FIG. 1A indicates that the resistive element 117 described in Japanese Unexamined Patent Application Publication No. 2007-165622 includes a first resistor 113, an auxiliary resistor 114, a second resistor 115, an inter-resistor insulating film 123, a contact 131, and wiring 135. The inter-resistor insulating film 123 is formed between the first resistor 113 and the second resistor 115. The wiring 135 couples the first resistor 113 with the second resistor 115 in series. In the resistive element 117, one end portions of the first and the second resistors 113 and 115 facing each other are coupled to each other by the wiring 135 via the contacts 131, and the other end portions are coupled to other elements (not shown in FIG. 1A) in the semiconductor device by the wiring 133 via the contacts 131.

FIG. 1B indicates that the first resistor 113 and the auxiliary resistor 114 respectively have side surfaces extended over an insulating film 121 over a substrate 111. The inter-resistor insulating film 123 is formed over the upper surfaces and side surfaces of the first resistor 113 and the auxiliary resistor 114 and the upper surface of the insulating film 121. The side surfaces of the second resistor 115 respectively face an extended side surface of the first resistor 113 and an extended side surface of the auxiliary resistor 114 via the insulating film 2 between resistors. The upper surface of the second resistor 115 forms substantially the same surface as that of the inter-resistor insulating film 123 which is formed over the first resistor 113 and the auxiliary resistor 114. The second resistor 115 is formed so that a sum of the width of the second resistor 115 and the width of the adjacent first resistor 113 (or the auxiliary resistor 114) is constant.

FIGS. 2A, 2B, and 2C are cross-sectional views showing a manufacturing process of the resistive element 117 described in Japanese Unexamined Patent Application Publication No. 2007-165622. FIG. 2A indicates that, in the manufacturing process, a polysilicon film to be a first resistor 13 and an auxiliary resistor 14 is etched and removed and belt-shaped polysilicon films to be the first resistor 113 and the auxiliary resistor 114 are formed. Thereafter, the inter-resistor insulating film 123 is formed over the insulating film 121 and the first resistor 113 so that the inter-resistor insulating film 123 also covers the side surfaces of the first resistor 113.

FIG. 2B indicates that, in the manufacturing process, a polysilicon film 215, which is a second polysilicon film, is formed over the inter-resistor insulating film 123 by an LPCVD method or the like so that the thickness of the polysilicon film 215 is larger than or equal to a difference between the height of the inter-resistor insulating film 123 over the upper surface of the first resistor 113 and the inter-resistor insulating film 123 over the upper surface of the insulating film 121.

FIG. 2C indicates that, in the manufacturing process, the polysilicon film 215 is thinned from the surface thereof by a CMP (Chemical and Mechanical Polishing) method so that the upper surface of the polysilicon film 215 forms one surface with the upper surface of the inter-resistor insulating film 123 over the first resistor 113.

In the resistive element 117 described in Japanese Unexamined Patent Application Publication No. 2007-165622, the second resistor 115 is formed between the first resistor 113 and the auxiliary resistor 114, and the first resistor 113 is coupled with the second resistor 115, so that the effects of process variation are suppressed. For example, when the width of the first resistor 113 and the auxiliary resistor 114 is larger than the designed width, the resistance value changes to be low. At this time, the width of the second resistor 115 becomes narrow depending on the width of the first resistor 113 (or the auxiliary resistor 114) is constant. Therefore, the resistance value of the second resistor 115 changes to be high, so that the change of the total resistance value is suppressed by coupling the first resistor 113 with the second resistor 115.

SUMMARY

When manufacturing the resistive element 117 described in Japanese Unexamined Patent Application Publication No. 2007-165622, as described above, the upper surface of the polysilicon film 215 is formed to be one surface with the upper surface of the inter-resistor insulating film 123 over the first resistor 113 by the CMP (Chemical and Mechanical Polishing) method. However, in the CMP in the process for forming the second resistor 115, the film thickness of the second resistor 115 may vary. The variation of the film thickness of the second resistor 115 causes variation of the resistance value of the entire resistive element 117, so that it prevents the resistive element 117 from being precise. A problem to be solved by the present invention is to provide a higher precision resistive element in which the variation of the resistance value due to the variation of the film thickness is suppressed.

Hereinafter, "means for solving the problem" will be described by using reference numerals used in "DETAILED DESCRIPTION". The reference numerals are added to clarify correspondence relationship between the description of "WHAT IS CLAIMED IS:" and "DETAILED DESCRIPTION". However, the reference numerals must not be used to interpret the technical scope of the invention described in "WHAT IS CLAIMED IS:".

To solve the problem described above, a resistive element includes a resistive element first portion (2) which is formed with a first film thickness (T1) (H1) and has a first width (W1) and a resistive element second portion (3) which is formed with the first film thickness (T1) (H1) and has a second width (W2) determined depending on the first width (W1). Here, the sum of the first width and the second width is constant. The resistive element first portion (2) has an upper surface of the resistive element first portion (2) at a position at which a height from the bottom surface of the resistive element first portion (2) is a first height (H1). The resistive element second portion (3) has an upper surface of the resistive element second portion (3) at a position at which a height from a surface including the bottom surface of the resistive element first portion (2) is the first height (H1). The resistive element first portion (2) and the resistive element second portion (3) are coupled to each other via a coupling portion.

In the resistive element as described above, even when the width of the resistive element first portion (2) changes due to manufacturing variation, the width of the resistive element second portion (3) changes corresponding to the change. A basic resistance component is formed by coupling both portions together. The resistive element first portion (2) and the resistive element second portion (3) are formed without changing the film thickness of an electric conductive film (polysilicon film) formed in the same process.

The resistive element for solving the problem described above can be formed by performing the processes [a] to [g] described below. In a method of manufacturing the resistive element, [a] Determining a first portion disposition planned area (13) in which a resistive element first portion (2) having a first width (W1) is provided and a second portion disposition planned area (14) in which a resistive element second portion (3) having a second width (W2) is provided. [b] Forming an electric conductive film (15) having a first film thickness (T1) over a first insulating film (12) formed over a substrate (12). [c] Forming a second insulating film (17) having a trench-shaped first opening portion (19) over the electric conductive film (15) in the first portion disposition planned area (13) and the electric conductive film (15) in the second portion disposition planned area (14). [d] Forming a second opening portion (22) in the electric conductive film (15) by covering the second portion disposition planned area (14) with a first resist (21) and selectively etching the electric conductive film (15) in the first portion disposition planned area (13) using the second insulating film (17) that is not covered by the first resist (21) as a mask. [e] Removing the first resist (21), thereafter burying the first opening portion (19) and the second opening portion (22) with a third insulating film (23) having an etching rate different from that of the second insulating film (17), and thereafter removing the second insulating film (17). [f] Covering the third insulating film (23) and the electric conductive film (15) in the first portion disposition planned area (13) with a second resist. (g) Forming a third opening portion in the electric conductive film (15) by selectively etching the electric conductive film (15) using the third insulating film (23) that is not covered by the second resist as a mask.

As described above, in the method of manufacturing a resistive element for solving the problem described above, the resistive element first portion (2) and the resistive element second portion (3) are formed without performing a flattening process on the electric conductive film (15) having the first film thickness (T1). The resistive element first portion (2) and the resistive element second portion (3) define the widths of each other in a self-aligning manner by using the insulating film when the resistive element first portion (2) and the resistive element second portion (3) are formed.

An effect that can be obtained from a typical invention among the inventions disclosed in this application is briefly described as follows: It is possible to provide a higher precision resistive element in which variation of the resistance value due to variation of the film thickness is suppressed.

BRIEF DESCRIPTION OF THE DRAWINGS

FIG. 4 is a cross-sectional view illustrating the configuration of the resistive element of the first embodiment;

FIG. 5A is a cross-sectional view illustrating a state of a semiconductor material in a first stage in a manufacturing process of the resistive element of the first embodiment;

FIG. 7A is a cross-sectional view illustrating the state of the semiconductor material in a third stage in the manufacturing process of the resistive element of the first embodiment;

FIG. 10B is a plan view illustrating the state of the semiconductor material in the sixth stage in the manufacturing process of the resistive element of the first embodiment.

FIG. 17A is a cross-sectional view illustrating the state of the semiconductor material in a thirteenth stage in the manufacturing process of the resistive element of the first embodiment;

DETAILED DESCRIPTION

First Embodiment

Figure 1A:
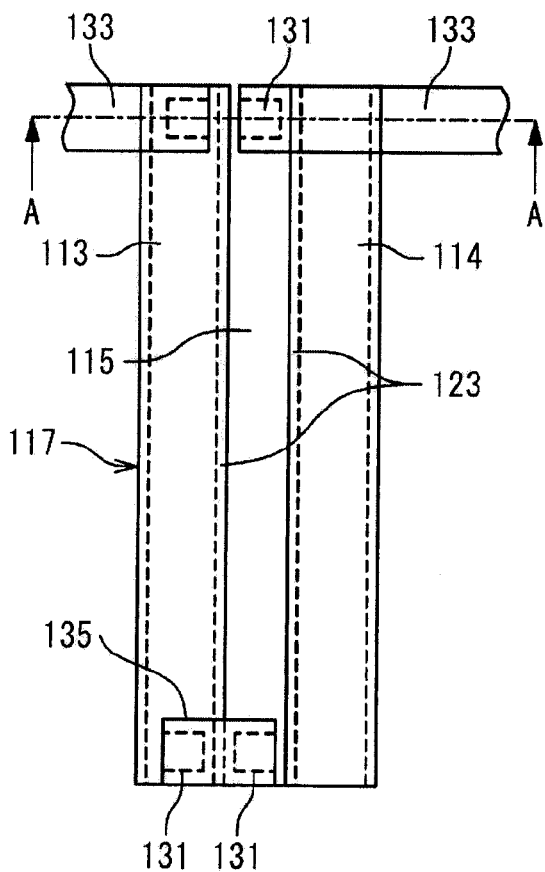
FIGS. 1A and 1B are diagrams showing a configuration of a resistive element of a related art.
Figure 1B:
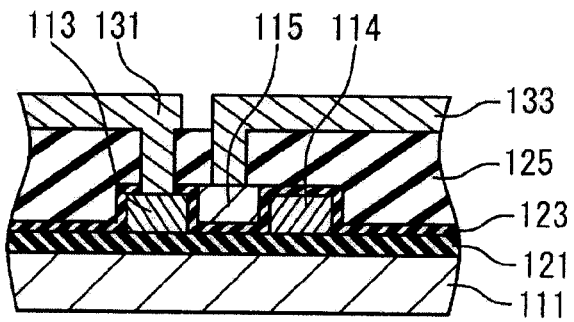
Figure 2A:
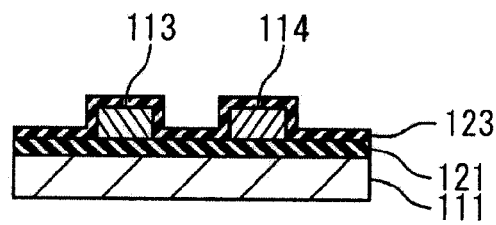
FIGS. 2A, 2B, and 2C are cross-sectional views showing a manufacturing process of the resistive element of the related art.
Figure 2B:
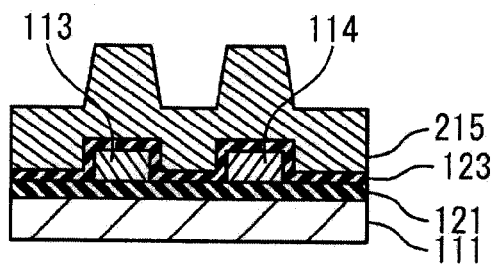
Figure 2C:
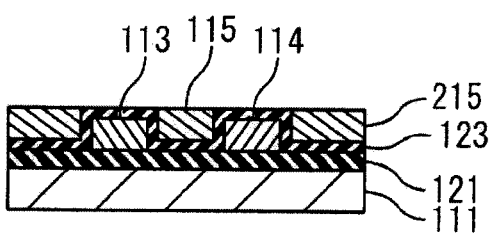
Figure 3:
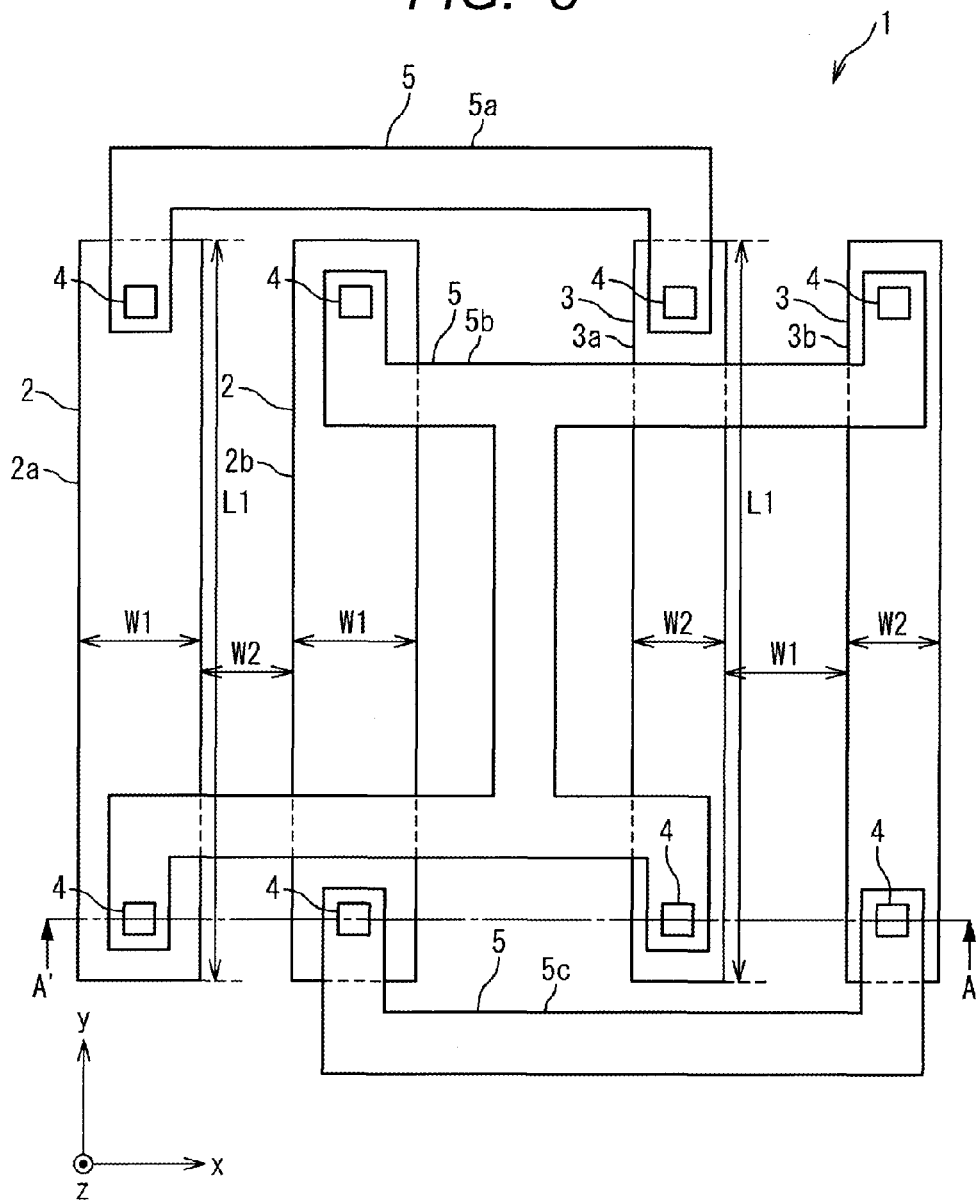
FIG. 3 is a plan view illustrating a configuration of a resistive element of a first embodiment.

Hereinafter, an embodiment of the present invention will be described with reference to the drawings. In the drawings for explaining the embodiment, the same reference numerals are given to the same portions, and redundant description will be omitted. FIG. 3 is a plan view illustrating a configuration of a resistive element 1 of the present embodiment. The resistive element 1 of the present embodiment includes resistive element first portions 2, resistive element second portions 3, contacts 4, and coupling lines 5. The resistive element first portion 2 and the resistive element second portion 3 are covered by an interlayer insulating film 6. In a first embodiment described below, the resistive element 1 including two resistive element first portions 2 and two resistive element second portions 3 is illustrated. This configuration is used to easily understand the resistive element 1 of the present embodiment, and this configuration does not limit the number of the resistive element first portions 2 and the resistive element second portions 3 in the resistive element 1. In the embodiment described below, when distinguishing multiple resistive element first portions 2 or multiple resistive element second portions 3, reference numerals with a suffix (for example, "2a") are used to describe the embodiment.

FIG. 3 indicates that the resistive element first portion 2 is formed of polysilicon having a length of L1 and a first width of W1. The resistive element first portion 2 (resistive element first portion 2a) is disposed at a position apart from another resistive element first portion 2 (resistive element first portion 2b) disposed next to the resistive element first portion 2a by a distance equal to a second width W2. The resistive element second portion 3 is formed of polysilicon having a length of L1 and a second width of W2. The resistive element second portion 3 (resistive element second portion 3a) is disposed at a position apart from another resistive element second portion 3 (resistive element second portion 3b) disposed next to the resistive element second portion 3a by a distance equal to the first width W1.

The coupling lines 5 couple the resistive element first portions 2 with the resistive element second portions 3 disposed independently from the resistive element first portions 2 via the contacts 4. The coupling lines 5 include a first coupling line 5a, a second coupling line 5b, and a third coupling line 5c. The first coupling line 5a provides a function of one input/output terminal of the resistive element 1. The third coupling line 5c provides a function of the other input/output terminal of the resistive element 3.

As shown in FIG. 3, one end portion of the resistive element first portion 2a is coupled to the first coupling line 5a via a contact 4. The other end portion of the resistive element first portion 2a is coupled to the second coupling line 5b via a contact 4. Similarly, one end portion of the resistive element first portion 2b is coupled to the third coupling line 5c via a contact 4. The other end portion of the resistive element first portion 2b is coupled to the second coupling line 5b via a contact 4.

One end portion of the resistive element second portion 3a is coupled to the first coupling line 5a via a contact 4. The other end portion of the resistive element second portion 3a is coupled to the second coupling line 5b via a contact 4. Similarly, one end portion of the resistive element second portion 3b is coupled to the third coupling line 5c via a contact 4. The other end portion of the resistive element second portion 3b is coupled to the second coupling line 5b via a contact 4.

FIG. 4 is a cross-sectional view illustrating a configuration of a cross-section taken along line A-A in the plan view of FIG. 3. In the resistive element 1 of the present embodiment, the resistive element first portions 2 and the resistive element second portions 3 are disposed over an oxide film 12 provided over the substrate 11. As shown in FIG. 4, the resistive element first portions 2 and the resistive element second portions 3 are formed so that the heights thereof from the upper surface of the oxide film 12 are H1. In the resistive element 1 of the present embodiment, the resistive element first portion 2 and the resistive element second portion 3 are formed so that the sum of the first width W1 and the second width W2 is a constant value (W).

As described above, in the resistive element 1 of the present embodiment, it is possible to form the resistive element first portion 2 having the first width W1 and the resistive element second portion 3 having the second width W2 without generating variation of the film thicknesses. The resistive element first portions 2 and the resistive element second portions 3 are coupled together to form the resistive element 1, so that the high-precision resistive element 1 can be formed.

Figure 5B:
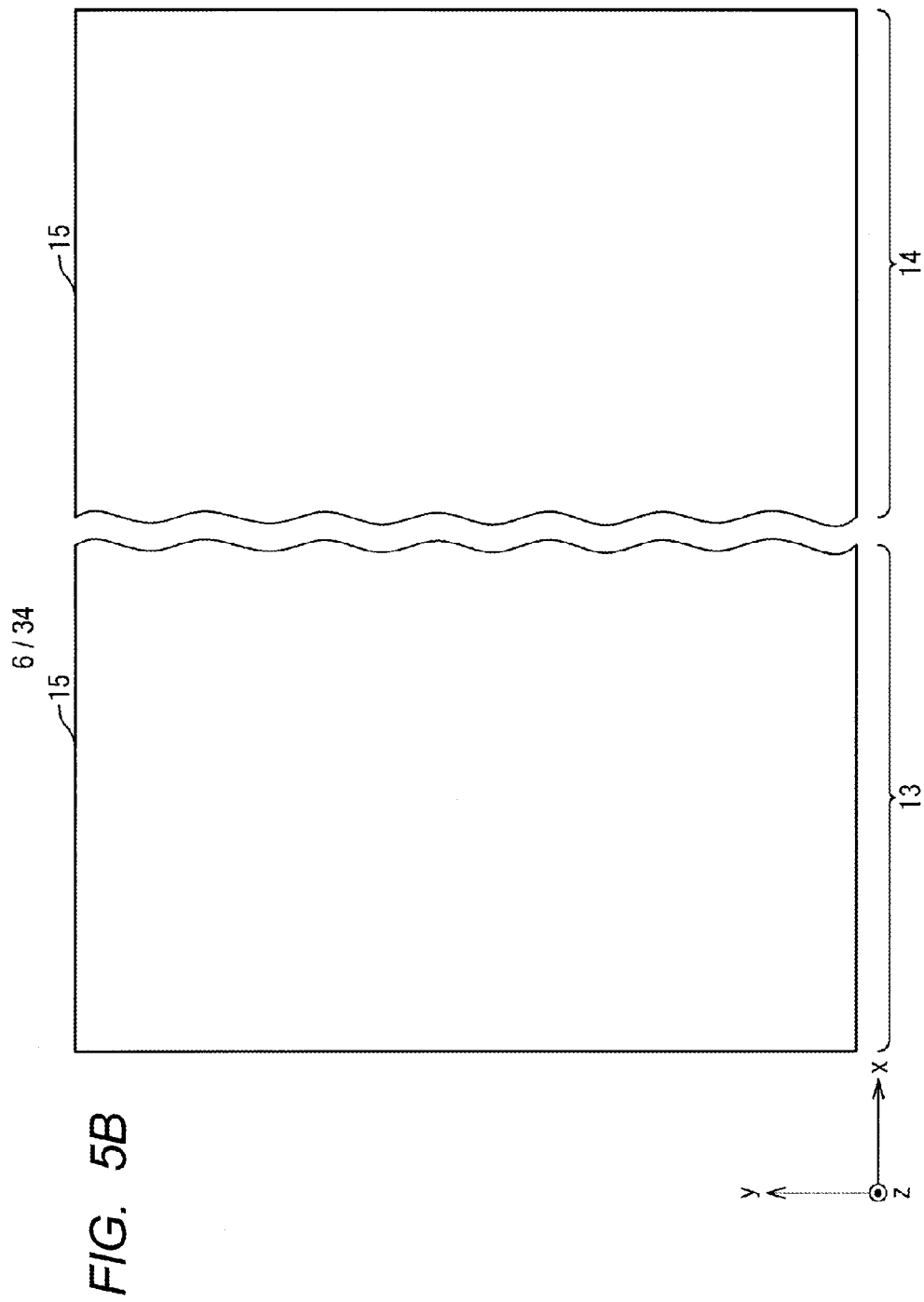
FIG. 5B is a plan view illustrating the state of the semiconductor material in the first stage in the manufacturing process of the resistive element of the first embodiment.

Hereinafter, a manufacturing process of the resistive element 1 of the present embodiment will be described. FIG. 5A is a cross-sectional view illustrating a state of a semiconductor material in a first stage in the manufacturing process of the resistive element 1 of the present embodiment. FIG. 5B is a plan view illustrating the state of the semiconductor material in the first stage. The semiconductor material in the manufacturing process of the resistive element 1 of the present embodiment includes a resistive element first portion forming area 13 and a resistive element second portion forming area 14. The resistive element first portions 2 are formed in the resistive element first portion forming area 13 and the resistive element second portions 3 are formed in the resistive element second portion forming area 14.

As shown in FIG. 5A, in the first stage, the oxide film 12 is formed over the substrate 11 and the polysilicon film 15 having a film thickness of T1 is formed over the oxide film 12. Thereafter, impurities are introduced into the polysilicon film 15 by ion implantation. The thickness T1 of the polysilicon film 15 is maintained in the subsequent processes, and finally, the thickness T1 becomes the height H1 which is a height of the resistive element first portions 2 and the resistive element second portions 3 from the bottom surfaces thereof.

As shown in FIG. 5B, in the first stage, the oxide film 12 is formed in the resistive element first portion forming area 13 and the resistive element second portion forming area 14, and then, the polysilicon film 15 is formed over the oxide film 12 in the same process. Thereafter, impurities are introduced into the entire surface of the polysilicon film 15 by ion implantation so that the resistive element first portion 2 and the resistive element second portion 3 which are formed in the subsequent processes have a predetermined resistance value.

Figure 6:
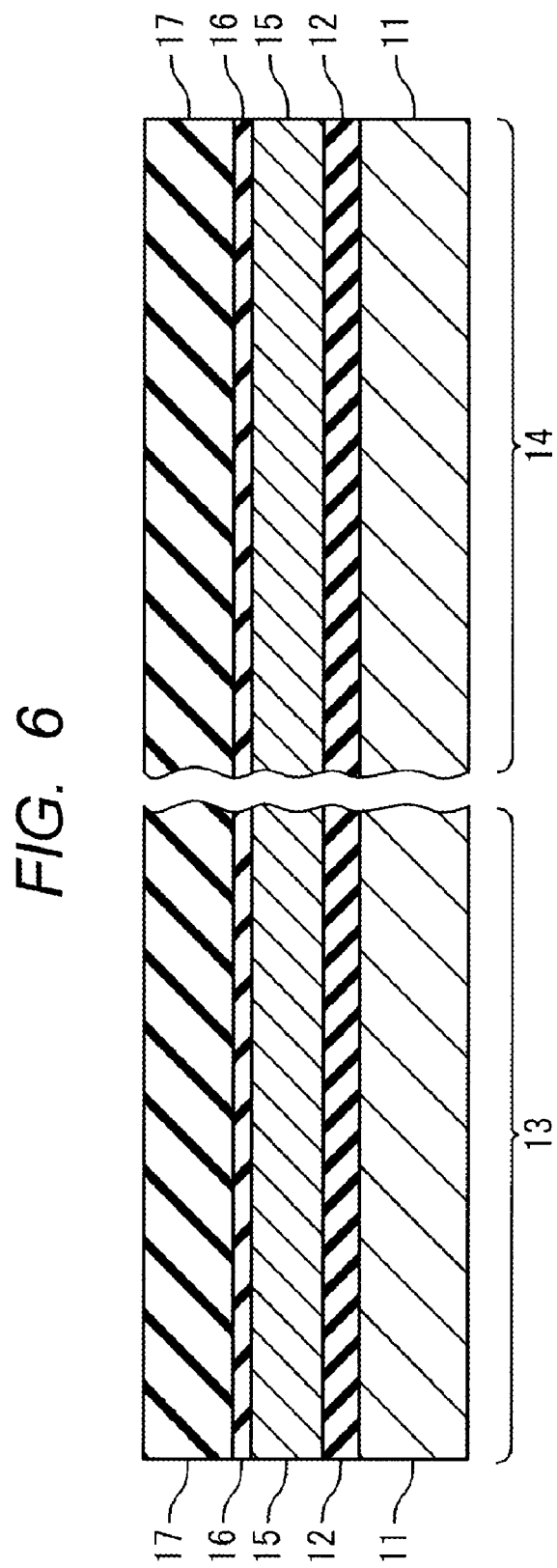
FIG. 6 is a cross-sectional view illustrating a state of the semiconductor material in a second stage in the manufacturing process of the resistive element of the first embodiment.

FIG. 6 is a cross-sectional view illustrating the state of the semiconductor material in a second stage in the manufacturing process of the resistive element 1 of the present embodiment. In the second stage, a protective oxide film 16 is formed in the resistive element first portion forming area 13 and the resistive element second portion forming area 14 in the same process, and then, a nitride film 17 is formed over the protective oxide film 16 in the same process.

Figure 7B:
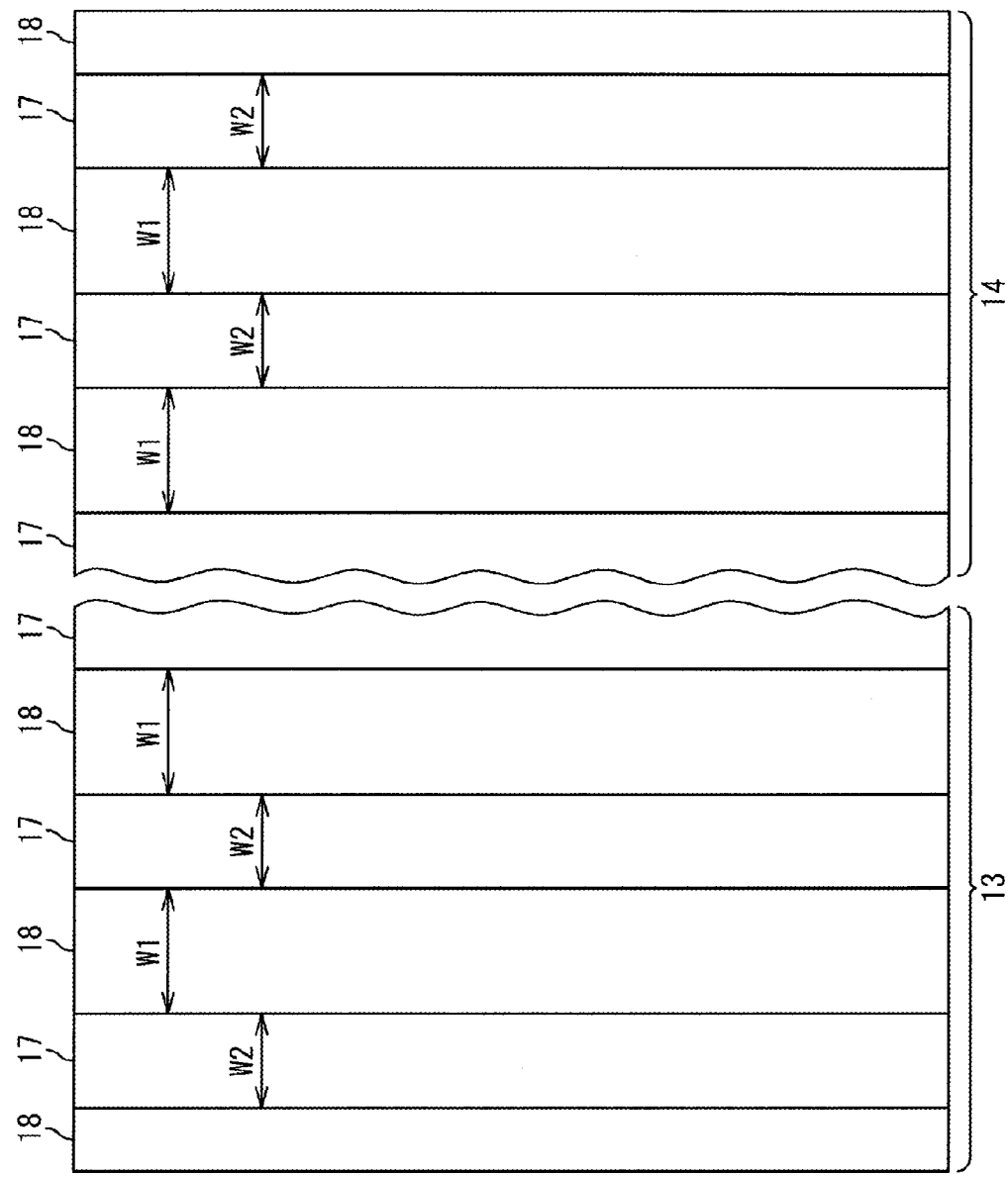
FIG. 7B is a plan view illustrating the state of the semiconductor material in the third stage in the manufacturing process of the resistive element of the first embodiment.

FIG. 7A is a cross-sectional view illustrating the state of the semiconductor material in a third stage in the manufacturing process of the resistive element 1 of the present embodiment. FIG. 7B is a plan view illustrating the state of the semiconductor material in the third stage. As shown in FIG. 7A, in the third stage, resist patterns 18 are formed over the nitride film 17. The resist pattern 18 is formed to have the first width W1. The resist patterns 18 adjacent to each other are disposed so that a gap between them is the second width W2.

As shown in FIG. 7B, multiple belt-shaped resist patterns 18 having the first width W1 are formed in the resistive element first portion forming area 13 and the resistive element second portion forming area 14, and the resist patterns 18 are disposed in substantially parallel with each other. The resist patterns 18 are disposed separately from each other so that a gap between them is the second width W2. The surface of the nitride film 17 is exposed between adjacent resist patterns 18.

Figure 8:
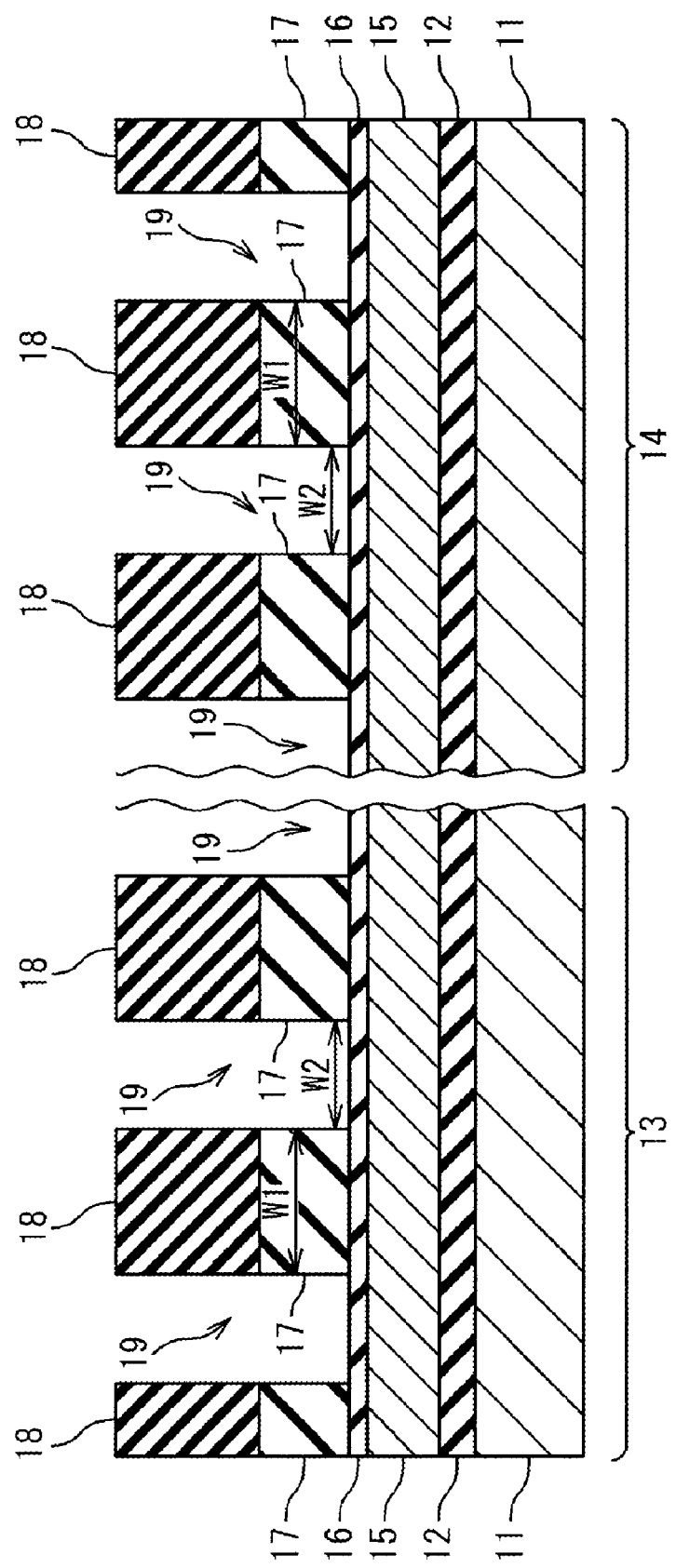
FIG. 8 is a cross-sectional view illustrating the state of the semiconductor material in a fourth stage in the manufacturing process of the resistive element of the first embodiment.

FIG. 8 is a cross-sectional view illustrating the state of the semiconductor material in a fourth stage in the manufacturing process of the resistive element 1 of the present embodiment. In the fourth stage, the surface of the protective oxide film 16 is exposed by selectively removing the nitride film 17 by anisotropic etching using the resist patterns 18 as a mask. First opening portions 19 having the second width W2 are formed by the anisotropic etching.

Figure 9:
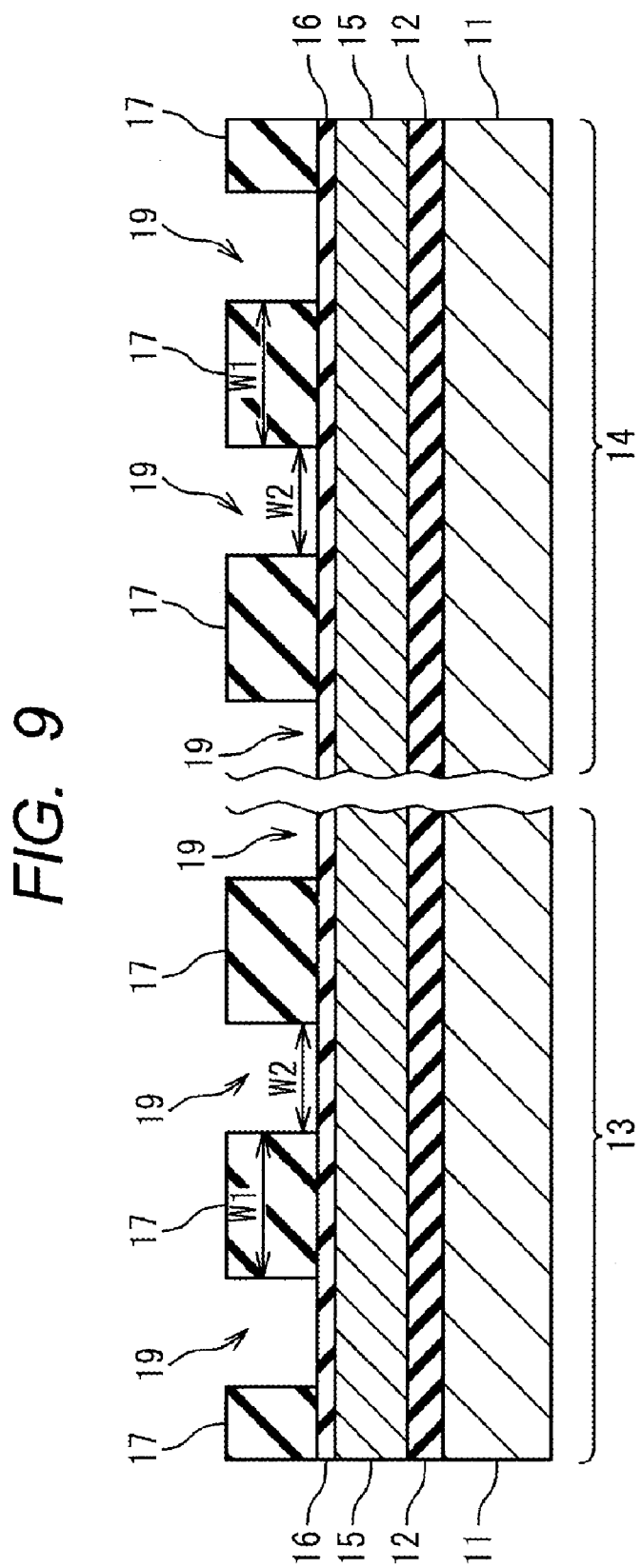
FIG. 9 is a cross-sectional view illustrating the state of the semiconductor material in a fifth stage in the manufacturing process of the resistive element of the first embodiment.

FIG. 9 is a cross-sectional view illustrating the state of the semiconductor material in a fifth stage in the manufacturing process of the resistive element 1 of the present embodiment. In the fifth stage, the resist patterns 18 over the nitride films 17 are removed, and the surfaces of the nitride films 17 covered by the resist patterns 18 are exposed.

Figure 10A:
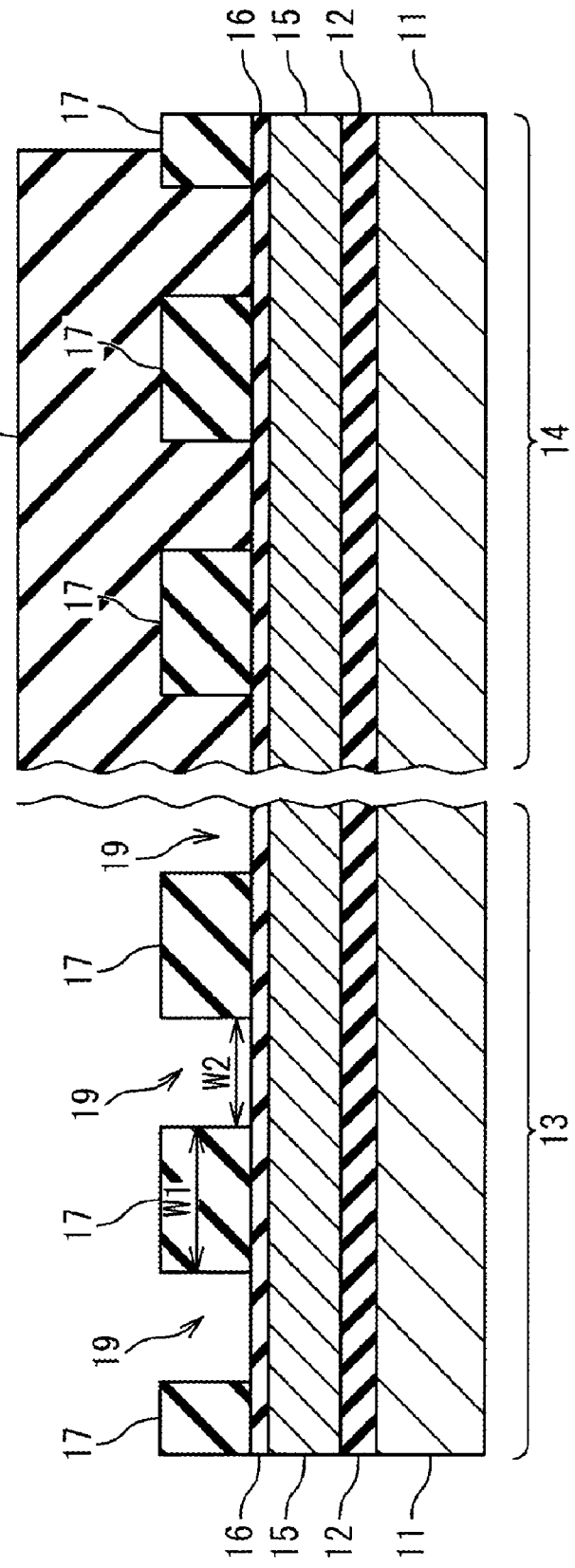
FIG. 10A is a cross-sectional view illustrating the state of the semiconductor material in a sixth stage in the manufacturing process of the resistive element of the first embodiment.

FIG. 10A is a cross-sectional view illustrating the state of the semiconductor material in a sixth stage in the manufacturing process of the resistive element 1 of the present embodiment. FIG. 10B is a plan view illustrating the state of the semiconductor material in the sixth stage in the manufacturing process of the resistive element 1 of the present embodiment. As shown in FIG. 10A, in the sixth stage, a resistive element second portion area resist 21 covers the nitride films 17 disposed in the resistive element second portion forming area 14 and the surface of the protective oxide film 16 exposed between the nitride films 17. As shown in FIG. 10B, in the sixth stage, the resistive element second portion area resist 21 having a length of L1 along a direction in which the nitride film 17 extends is formed. The resistive element second portion area resist 21 covers the protective oxide film 16 and the nitride films 17 in the resistive element second portion forming area 14, so that the polysilicon film 15 below the protective oxide film 16 and the nitride films 17 covered by the resistive element second portion area resist 21 is protected.

Figure 11:
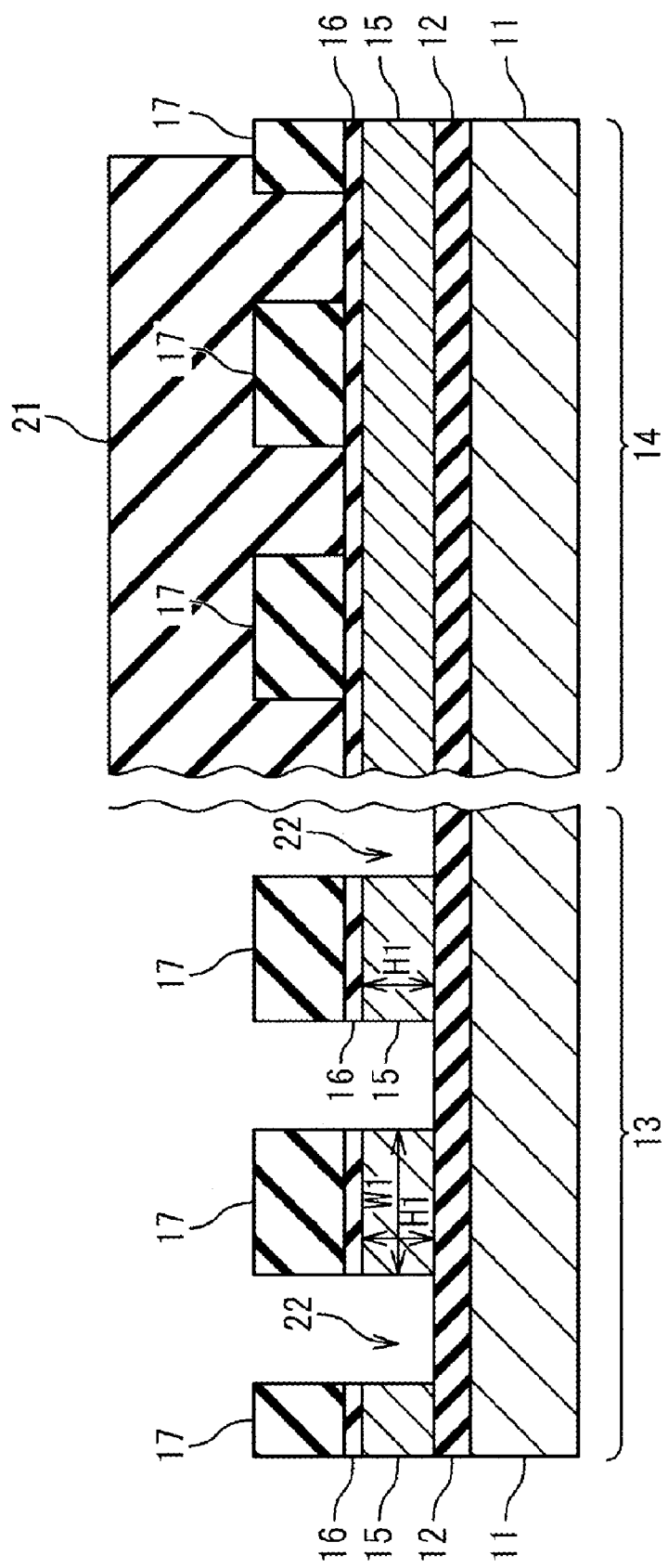
FIG. 11 is a cross-sectional view illustrating the state of the semiconductor material in a seventh stage in the manufacturing process of the resistive element of the first embodiment.

FIG. 11 is a cross-sectional view illustrating the state of the semiconductor material in a seventh stage in the manufacturing process of the resistive element 1 of the present embodiment. In the seventh stage, the protective oxide film 16 and the polysilicon film 15 are selectively removed by anisotropic etching using the nitride film 17 in the resistive element first portion forming area 13 as a mask. Second opening portions 22 having the second width W2 are formed by the anisotropic etching so that the surface of the oxide film 12 is exposed. The second opening portion 22 is formed as an opening portion coupled to the first opening portion 19. In the seventh stage, in the resistive element second portion forming area 14, the protective oxide film 16 and the polysilicon film 15 which are not covered by the resistive element second portion area resist 21 are selectively removed by anisotropic etching.

Figure 12A:
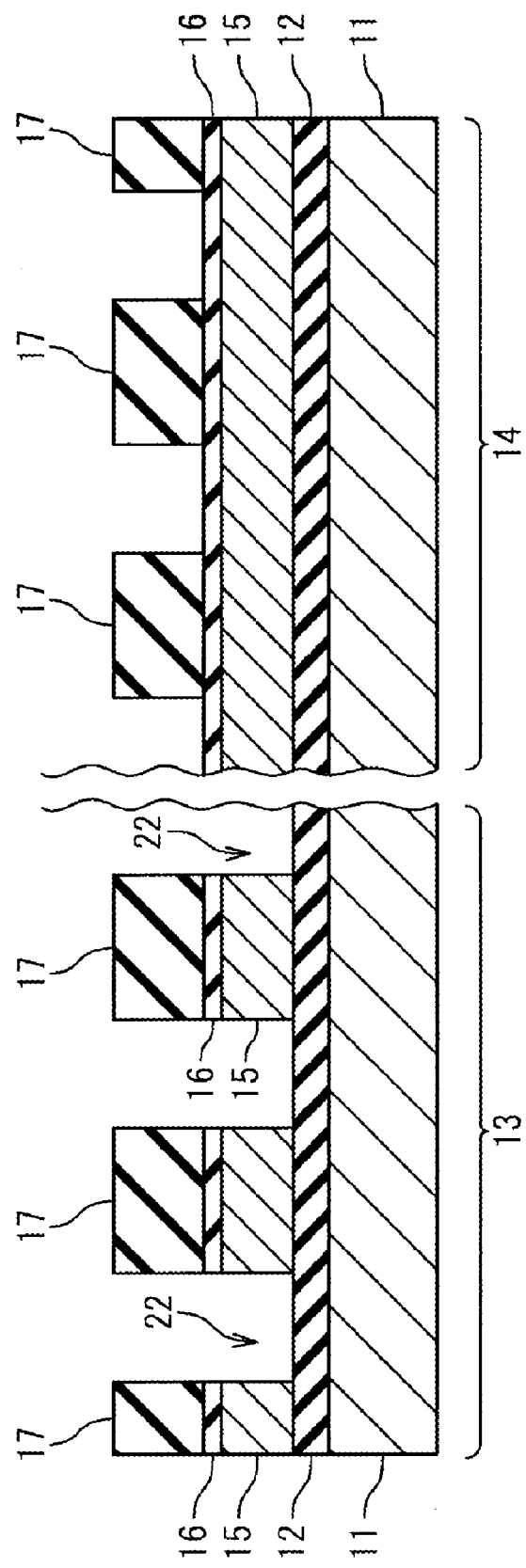
FIG. 12A is a cross-sectional view illustrating the state of the semiconductor material in an eighth stage in the manufacturing process of the resistive element of the first embodiment.
Figure 12B:
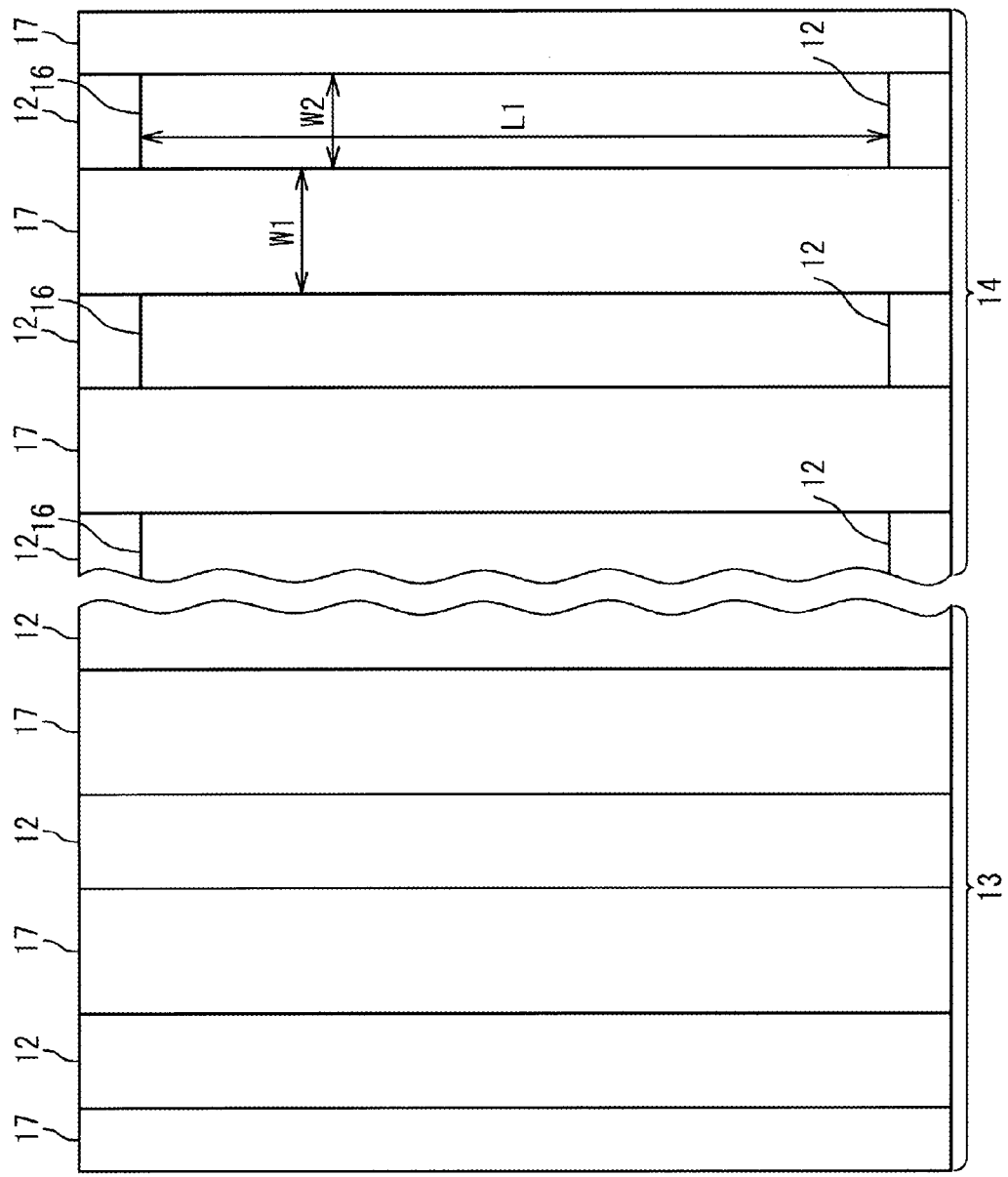
FIG. 12B is a plan view illustrating the state of the semiconductor material in the eighth stage in the manufacturing process of the resistive element of the first embodiment.

FIG. 12A is a cross-sectional view illustrating the state of the semiconductor material in an eighth stage in the manufacturing process of the resistive element 1 of the present embodiment. FIG. 12B is a plan view illustrating the state of the semiconductor material in the eighth stage in the manufacturing process of the resistive element 1 of the present embodiment. As shown in FIG. 12A, in the eighth stage, the resistive element second portion area resist 21 formed in the resistive element second portion forming area 14 is removed, and the nitride film 17 and the protective oxide film 16 which are covered by the resistive element second portion area resist 21 are exposed again. As shown in FIG. 12B, in the eighth stage, the resistive element second portion area resist 21 formed in the resistive element second portion forming area 14 is removed, so that the protective oxide film 16 and the nitride film 17 which are covered by the resistive element second portion area resist 21 are exposed. The protective oxide film 16 and the nitride film 17 which are not covered by the resistive element second portion area resist 21 are removed in the seventh stage described above, so that, as shown in FIG. 12B, the surface of the oxide film 12 in that area is exposed.

Figure 13:
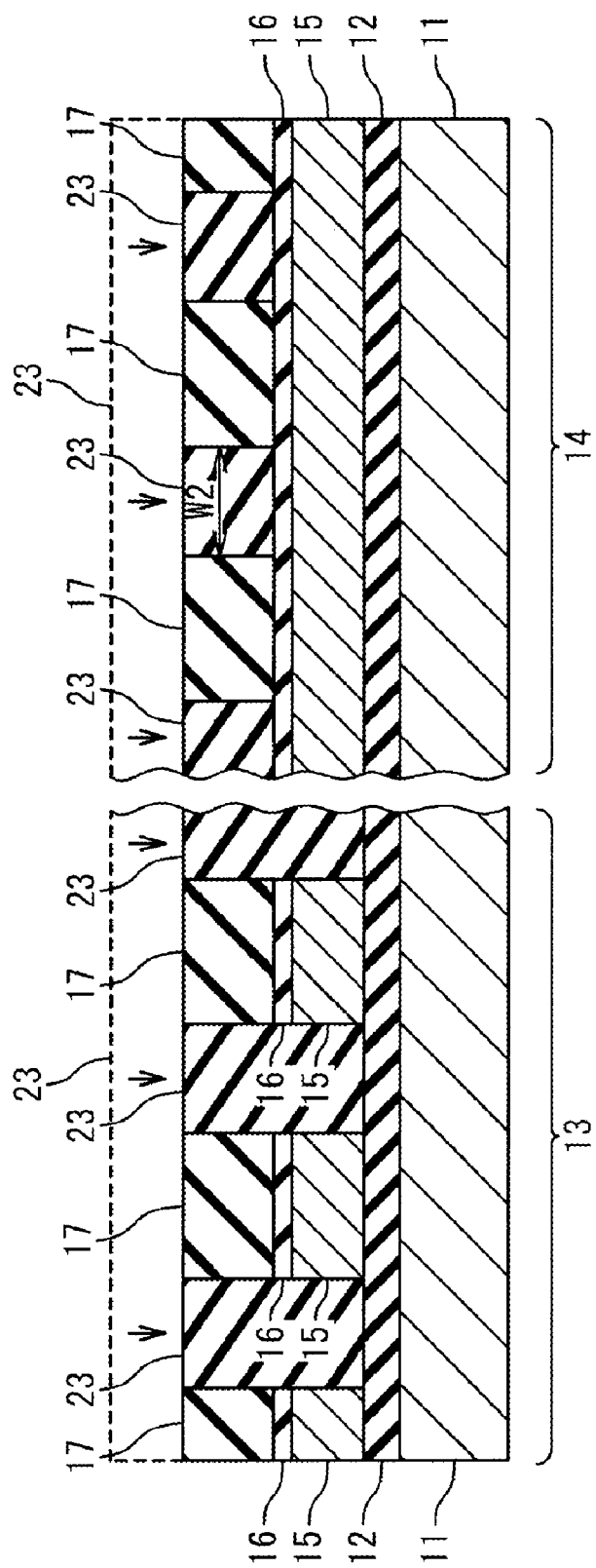
FIG. 13 is a cross-sectional view illustrating the state of the semiconductor material in a ninth stage in the manufacturing process of the resistive element of the first embodiment.

FIG. 13 is a cross-sectional view illustrating the state of the semiconductor material in a ninth stage in the manufacturing process of the resistive element 1 of the present embodiment. In the ninth stage, an oxide film 23 burying the opening portions (first opening portions 19 and second opening portions 22) are caused to grow. The oxide film 23 buries the first opening portions 19 and the second opening portions 22 and covers the nitride film 17 in the resistive element first portion forming area 13. In the resistive element second portion forming area 14, the oxide film 23 buries the first opening portions 19 which are exposed again when the resistive element second portion area resist 21 covering the first opening portions 19 is removed, as well as covers the exposed nitride film 17. Thereafter, in the resistive element first portion forming area 13 and the resistive element second portion forming area 14, the resistive element first portion forming area 13 is polished by CMP to flatten the oxide films 23 and the nitride films 17.

Figure 14:
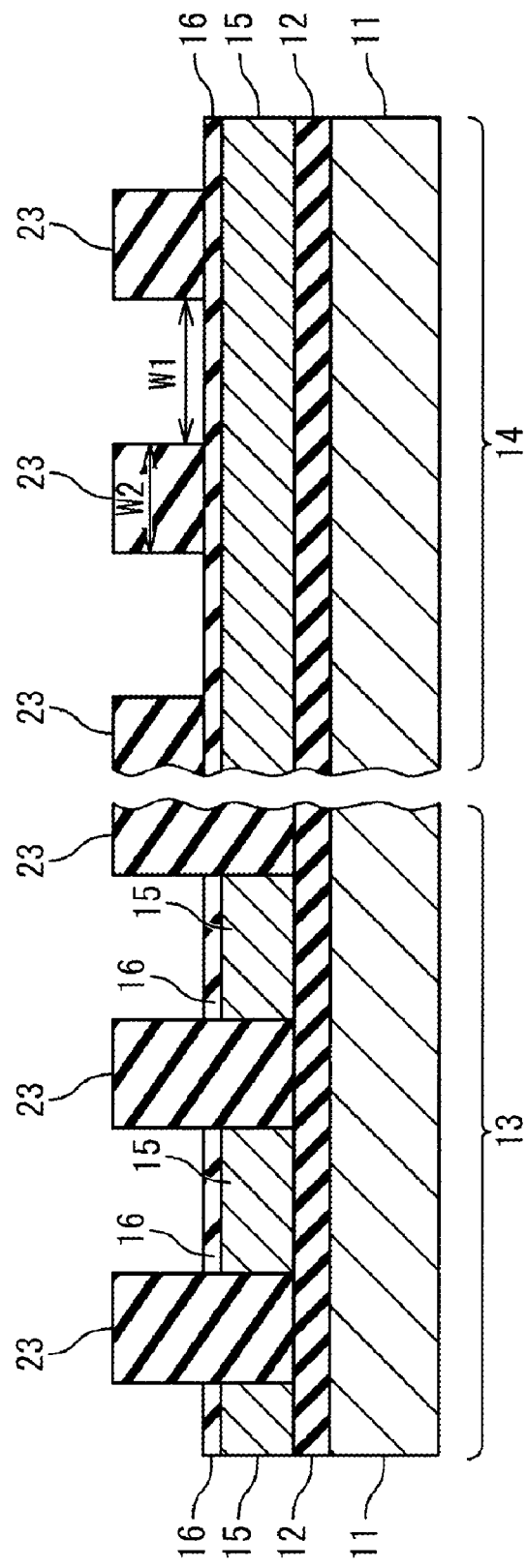
FIG. 14 is a cross-sectional view illustrating the state of the semiconductor material in a tenth stage in the manufacturing process of the resistive element of the first embodiment.

FIG. 14 is a cross-sectional view illustrating the state of the semiconductor material in a tenth stage in the manufacturing process of the resistive element 1 of the present embodiment. In the tenth stage, the nitride films 17 formed in the resistive element first portion forming area 13 and the resistive element second portion forming area 14 are removed, and the surface of the protective oxide film 16 located below the nitride films 17 is exposed. Thereby, opening portions having the first width W1 are formed over the polysilicon film 15 and the protective oxide film 16 in the resistive element second portion forming area 14.

Figure 15A:
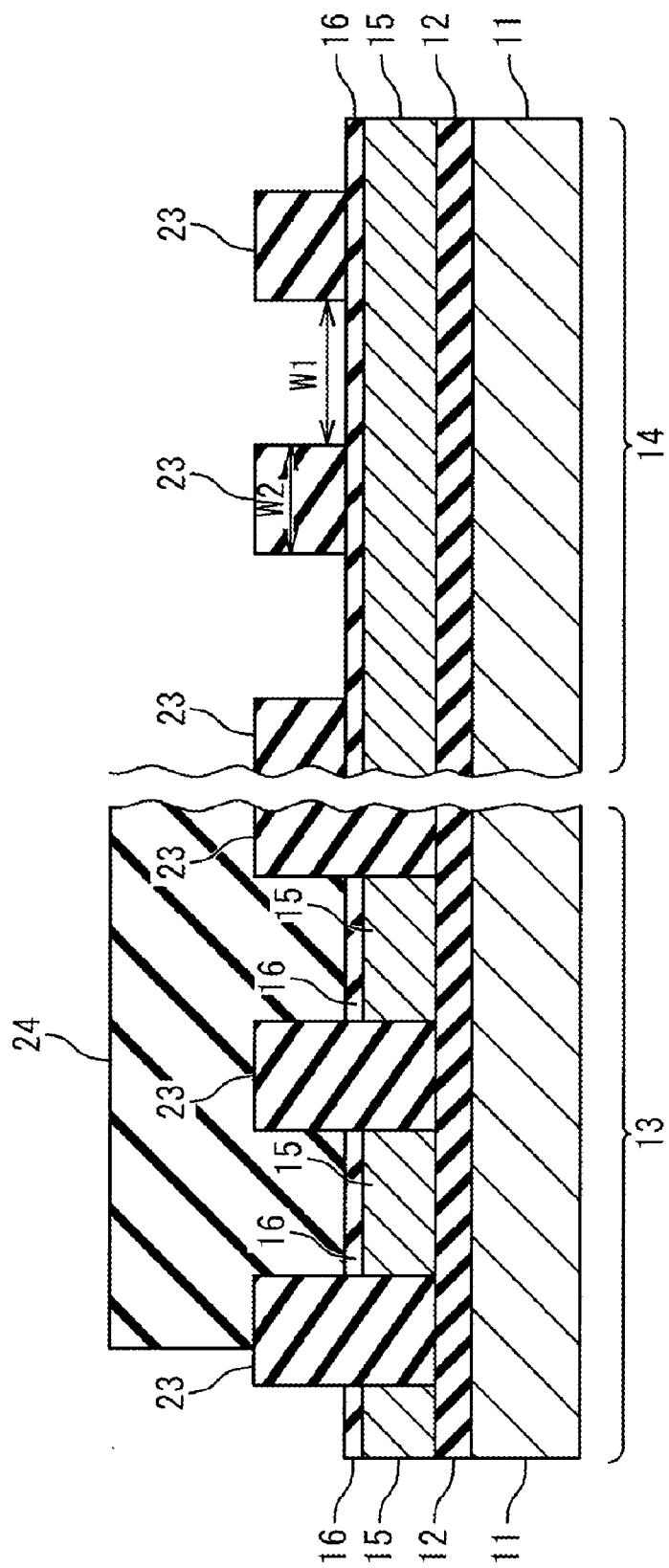
FIG. 15A is a cross-sectional view illustrating the state of the semiconductor material in an eleventh stage in the manufacturing process of the resistive element 1 of the first embodiment.
Figure 15B:
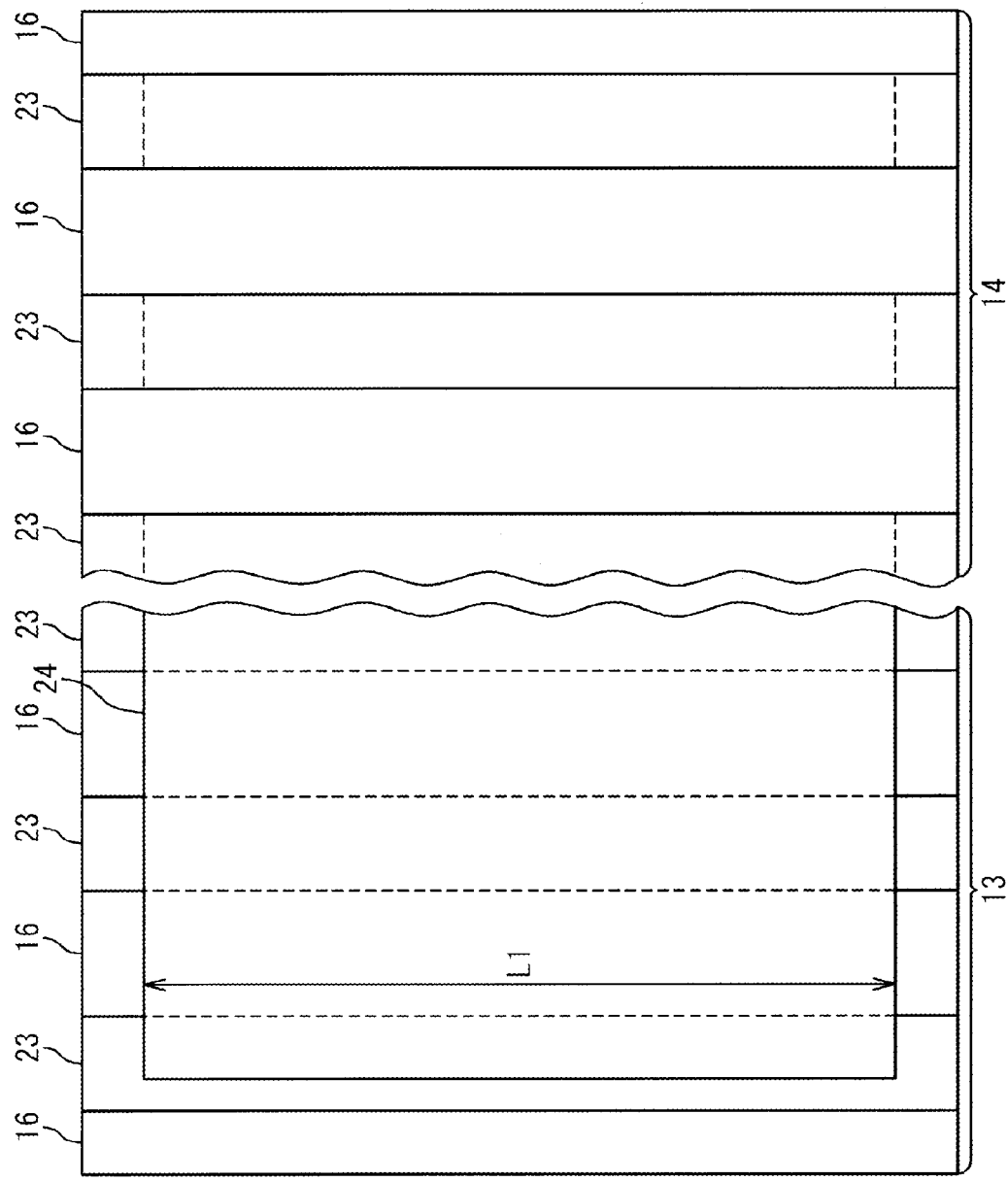
FIG. 15B is a plan view illustrating the state of the semiconductor material in the eleventh stage in the manufacturing process of the resistive element of the first embodiment.

FIG. 15A is a cross-sectional view illustrating the state of the semiconductor material in an eleventh stage in the manufacturing process of the resistive element 1 of the present embodiment. FIG. 15B is a plan view illustrating the state of the semiconductor material in the eleventh stage in the manufacturing process of the resistive element 1 of the present embodiment. As shown in FIG. 15A, in the eleventh stage, a resistive element first portion area resist 24 covers the oxide films 23 disposed in the resistive element first portion forming area 13 and the surface of the protective oxide film 16 exposed between the oxide films 23. As shown in FIG. 15B, in the eleventh stage, the resistive element first portion area resist 24 having a length of L1 along a direction in which the oxide film 23 extends is formed. The resistive element first portion area resist 24 covers the protective oxide films 16 and the oxide films 23 in the resistive element first portion forming area 13, so that the polysilicon film 15 below the protective oxide film 16 covered by the resistive element first portion area resist 24 is protected.

Figure 16:
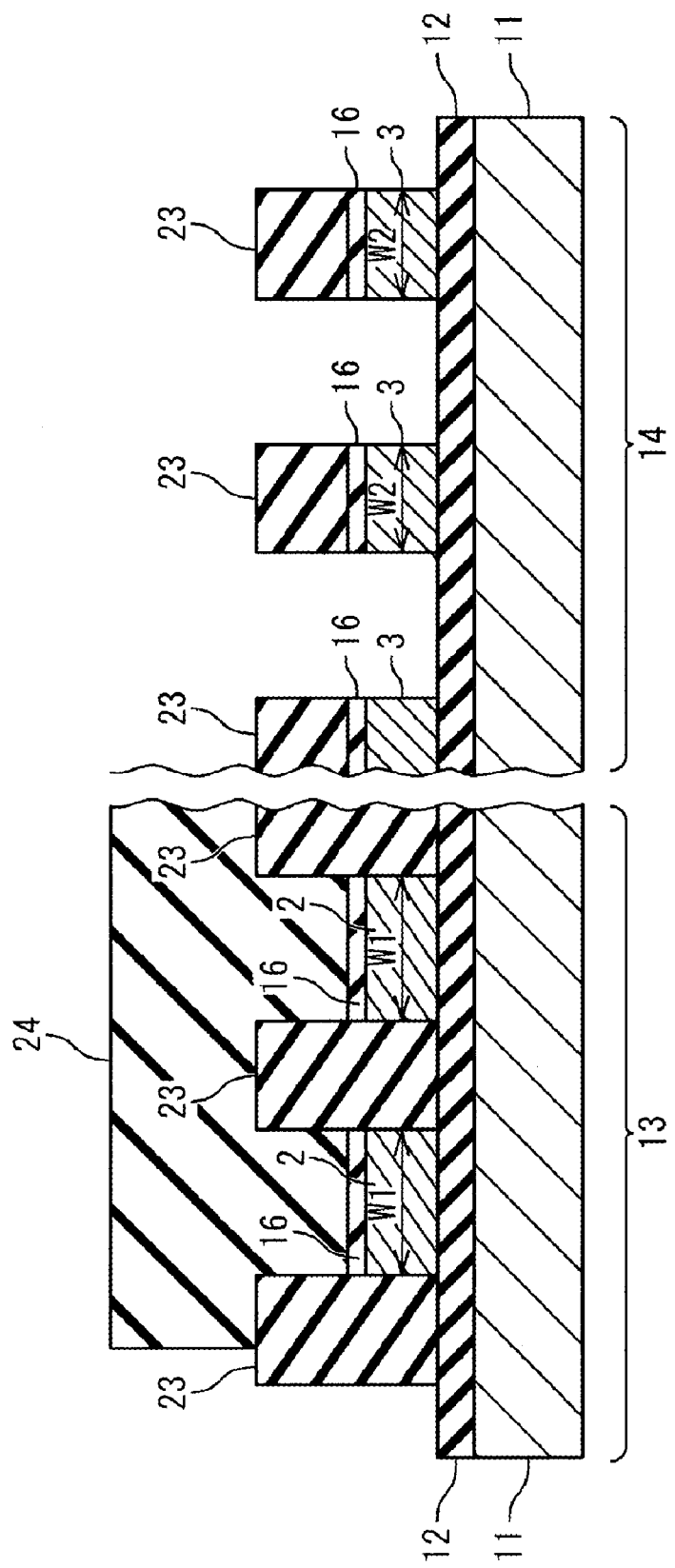
FIG. 16 is a cross-sectional view illustrating the state of the semiconductor material in a twelfth stage in the manufacturing process of the resistive element of the first embodiment.

FIG. 16 is a cross-sectional view illustrating the state of the semiconductor material in a twelfth stage in the manufacturing process of the resistive element 1 of the present embodiment. In the twelfth stage, the protective oxide film 16 exposed by using the oxide films 23 in the resistive element second portion forming area 14 as a mask and the polysilicon film 15 below the protective oxide film 16 are removed. At this time, in the resistive element first portion forming area 13, while the polysilicon film 15 covered by the resistive element first portion area resist 24 is protected, the protective oxide film 16 that is not covered by the resistive element first portion area resist 24 and the polysilicon film 15 below the protective oxide film 16 are removed. Thereby, the resistive element first portions 2 are formed in the resistive element first portion forming area 13 and the resistive element second portions 3 are formed in the resistive element second portion forming area 14.

Figure 17B:
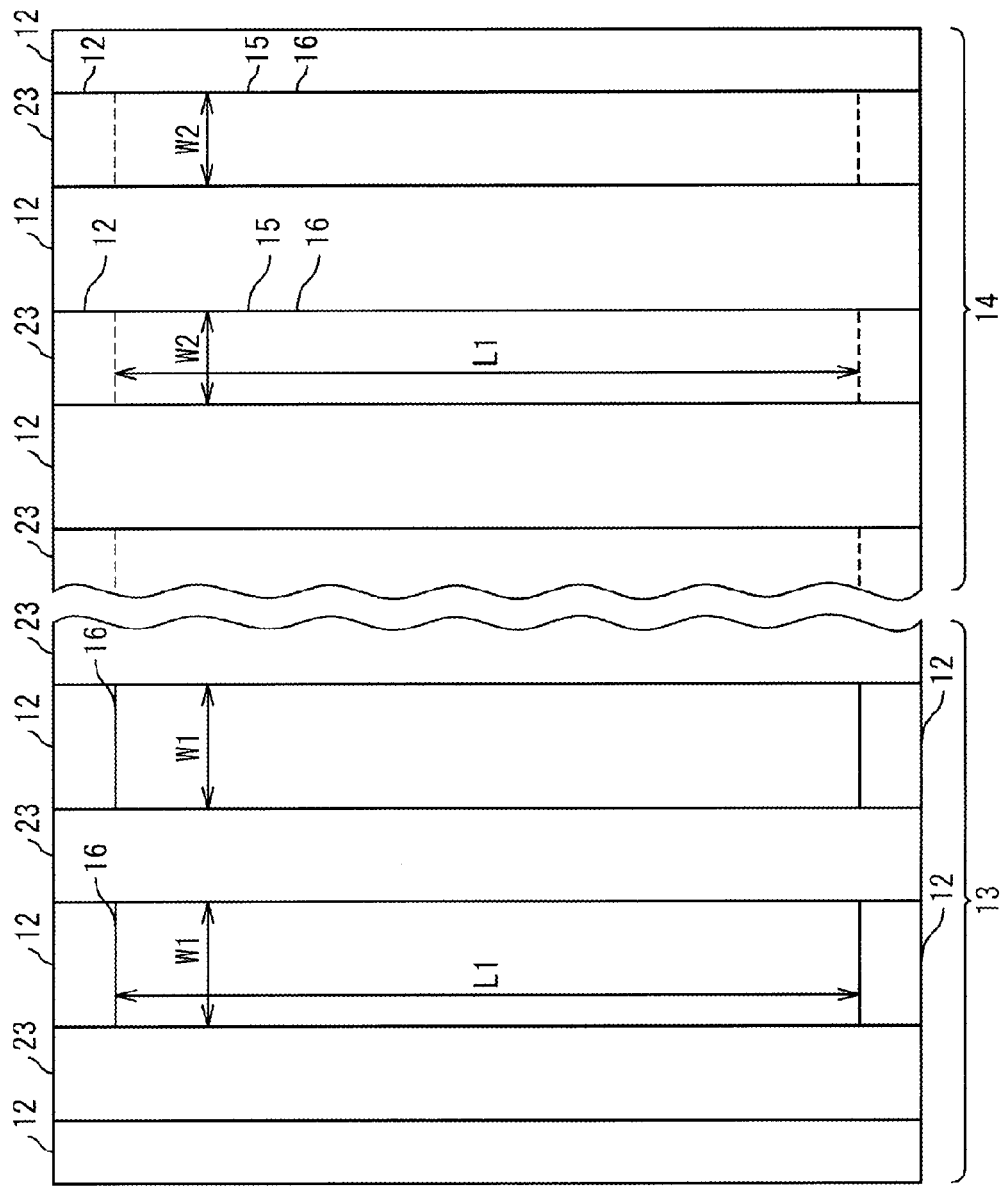
FIG. 17B is a plan view illustrating the state of the semiconductor material in the thirteenth stage in the manufacturing process of the resistive element of the first embodiment.

FIG. 17A is a cross-sectional view illustrating the state of the semiconductor material in a thirteenth stage in the manufacturing process of the resistive element 1 of the present embodiment. FIG. 17B is a plan view illustrating the state of the semiconductor material in the thirteenth stage in the manufacturing process of the resistive element 1 of the present embodiment. As shown in FIG. 17A, in the thirteenth stage, the resistive element first portion area resist 24 formed in the resistive element first portion forming area 13 is removed. As shown in FIG. 17B, the polysilicon films 15 in the resistive element first portion forming area 13 covered by the resistive element first portion area resist 24 are etched to have the length of L1, and thereby the shape of the resistive element first portion 2 is formed. The polysilicon films 15 in the resistive element second portion forming area 14 are etched to have the second width W2 in the twelfth stage described above, and thereby the shape of the resistive element second portion 3 is formed.

Figure 18:
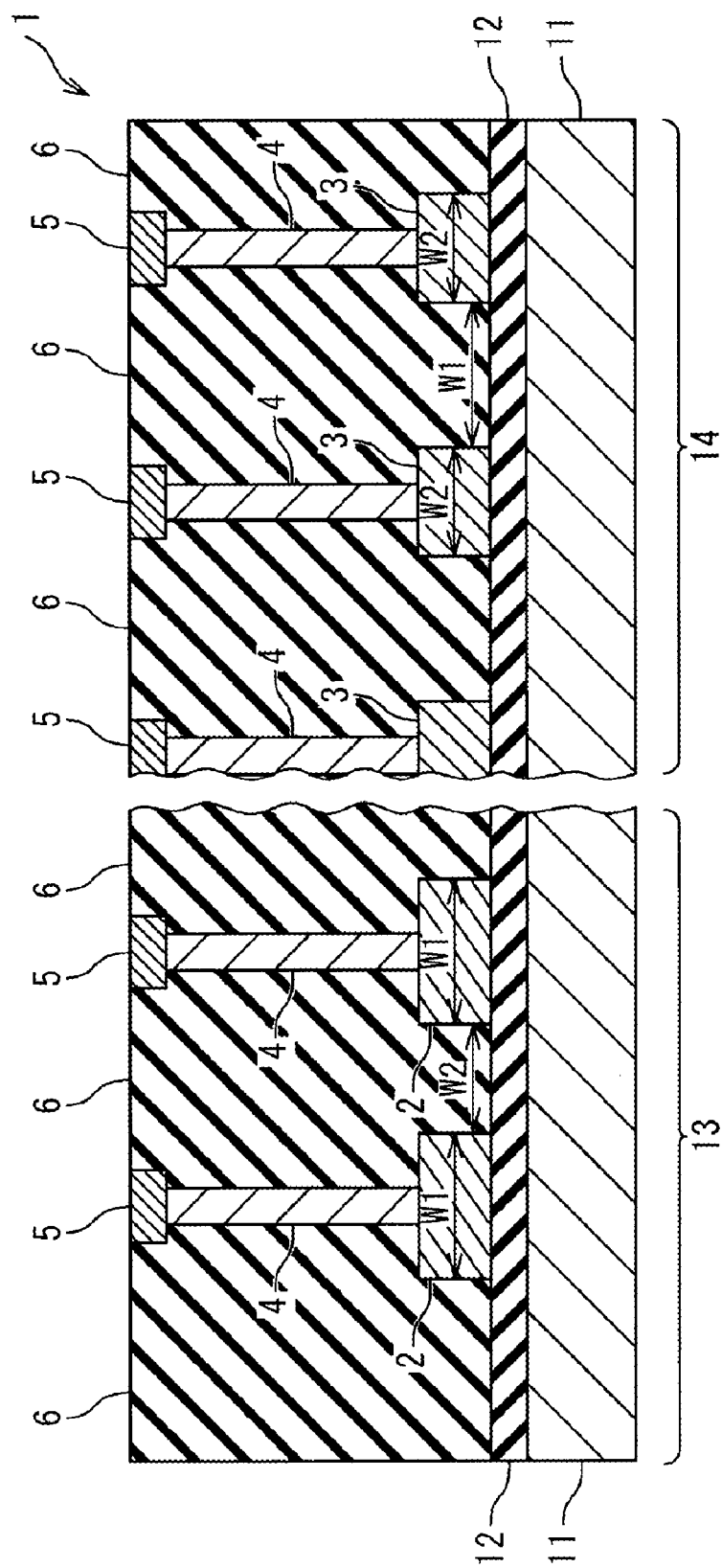
FIG. 18 is a cross-sectional view illustrating the state of the semiconductor material in a fourteenth stage in the manufacturing process of the resistive element of the first embodiment.

FIG. 18 is a cross-sectional view illustrating the state of the semiconductor material in a fourteenth stage in the manufacturing process of the resistive element 1 of the present embodiment. In the fourteenth stage, the interlayer insulating film 6 including the oxide film 23 and protective oxide film 16 are formed. Thereafter, the contacts 4 penetrating the interlayer insulating film 6 are formed. In the resistive element first portion forming area 13, the coupling lines 5 coupled to the resistive element first portions 2 via the contacts 4 are formed, and in the resistive element second portion forming area 14, the coupling lines 5 coupled to the resistive element second portions 3 via the contacts 4 are formed. The resistive element first portions 2 and the resistive element second portions 3 are coupled together via the coupling lines 5, so that the resistive element 1 having a predetermined resistance value is completed.

Comparative Example

Figure 19:
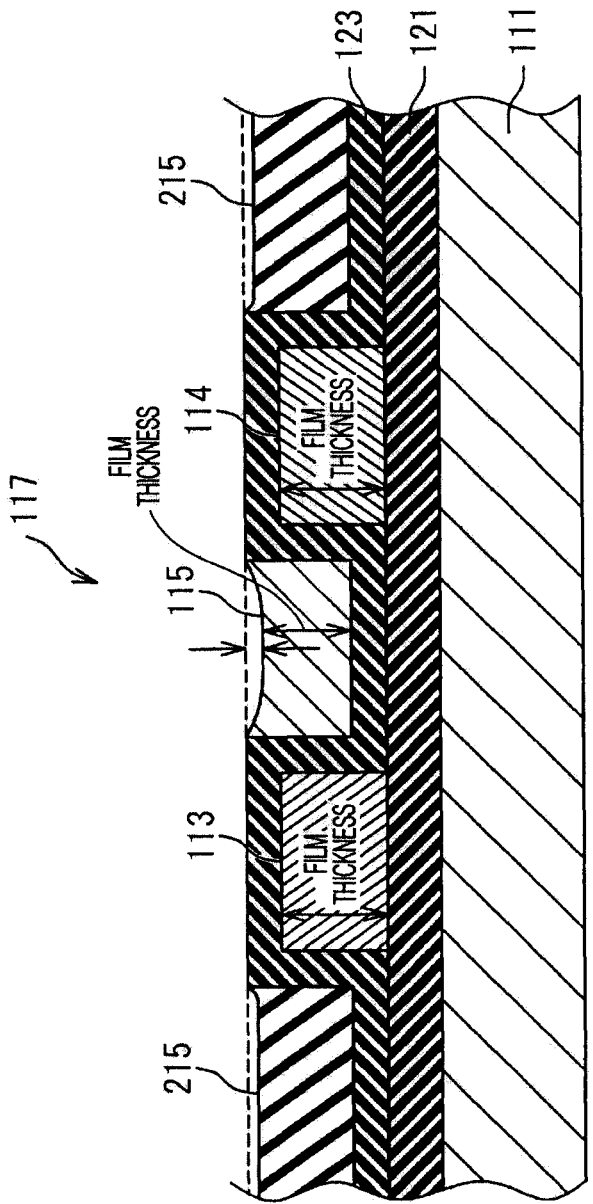
FIG. 19 is a cross-sectional view illustrating a configuration of a comparative example of the resistive element described in Japanese Unexamined Patent Application Publication No. 2007-165622.

Hereinafter, a comparative example of the present invention will be described. FIG. 19 is a cross-sectional view illustrating a configuration of a comparative example of the resistive element 117 described in the aforementioned Japanese Unexamined Patent Application Publication No. 2007-165622. The manufacturing process of the above-mentioned resistive element 117 includes a process for polishing polycrystalline silicon film by CMP. As shown in FIG. 19, when polishing the polycrystalline silicon film 215 so that the insulating film 121 covering the upper surface of the first resistor 113 (or the auxiliary resistor 114) is surely exposed, the film thickness of the second resistor 115 may be thinner than the thickness of the first resistor 113 (or the auxiliary resistor 114). When trying to prevent the thickness of the second resistor 115 from being thin, a redundant polycrystalline silicon material may remain over the insulating film 121.

The resistive element 1 of the present embodiment is formed without performing the CMP process performed on the resistive element 117 of the comparative example. Therefore, variation of the thicknesses in the resistive element first portions 2 and the resistive element second portions 3 is not generated, so that a higher-precision resistive element 1 can be formed. The resistive element first portions 2 and the resistive element second portions 3 define the widths of each other by using the insulating film when the resistive element first portions 2 and the resistive element second portions 3 are formed in a self-aligning manner. Therefore, it is not necessary to control the film thickness of the insulating film that insulates the resistive element first portions 2 from the resistive element second portions 3, and the sum of the first width W1 and the second width W2 can be always constant.

Second Embodiment

Figure 20:
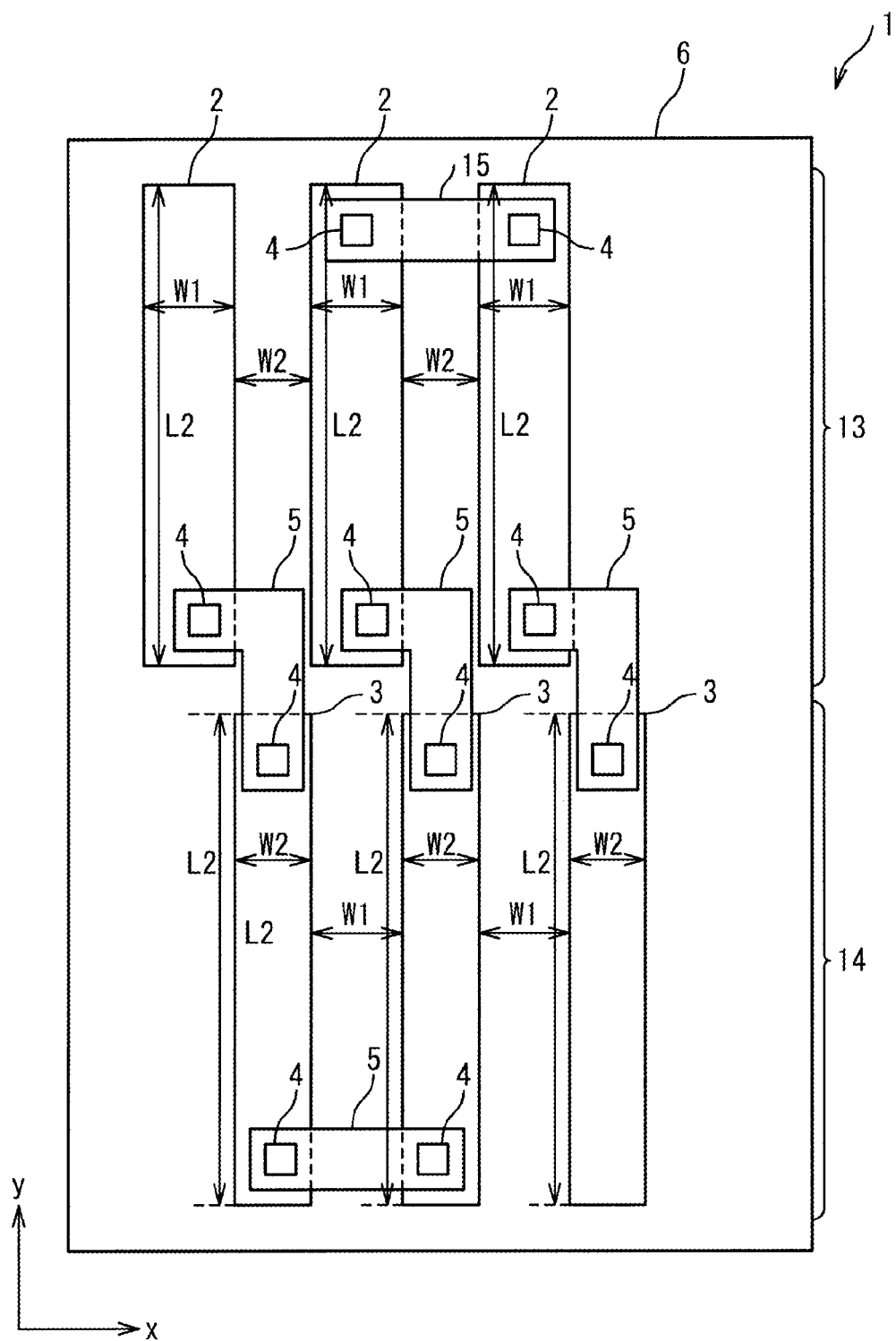
FIG. 20 is a plan view illustrating a configuration of a resistive element of a second embodiment.

Hereinafter, a second embodiment of the resistive element 1 of the present invention will be described. FIG. 20 is a plan view illustrating a configuration of the resistive element 1 of the second embodiment. In the resistive element 1 of the first embodiment described above, the resistive element first portions 2 and the resistive element second portions 3 are arranged sequentially in the x direction with respect to the coordinate axes in FIG. 3. As shown in FIG. 20, the resistive element 1 of the second embodiment is formed so that the resistive element first portion forming area 13 in which the resistive element first portions 2 are disposed and the resistive element second portion forming area 14 in which the resistive element second portions 3 are disposed are aligned in the y direction. In the second embodiment described below, the resistive element 1 in which three resistive element first portions 2 are coupled to three resistive element second portions 3 in series is illustrated. This configuration is used to easily understand the resistive element 1 of the present embodiment, and this configuration does not limit the number and coupling of the resistive element first portions 2 and the resistive element second portions 3 in the resistive element 1.

When forming the resistive element 1 of the first embodiment, there is concern that, as the number of resistors increases, the number of the first coupling lines 5a and the third coupling lines 5c increases in the horizontal direction, the wiring area increases, and the coupling is complicated. In the resistive element 1 of the second embodiment, free spaces generated when the resistive element first portions 2 and the resistive element second portions 3 are formed are used as areas in which the upper layer lines are disposed, and thereby it is possible to suppress the increase of the wiring area and simplify the line coupling.

Figure 21:
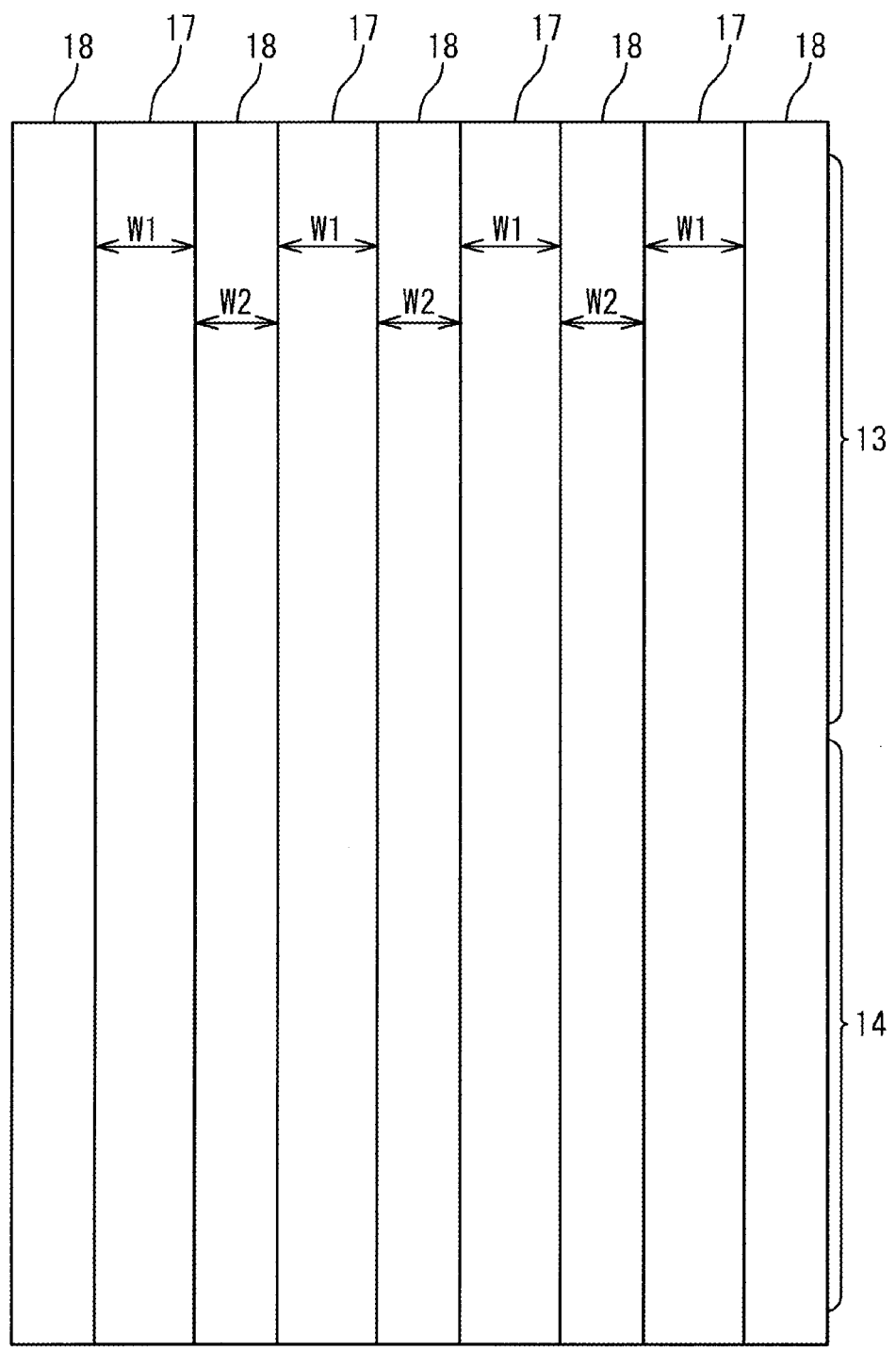
FIG. 21 is a plan view illustrating a state of a semiconductor material in a first manufacturing process of the resistive element of the second embodiment.

FIG. 21 is a plan view illustrating a state of a semiconductor material in a first manufacturing process of the resistive element 1 of the second embodiment. FIG. 21 corresponds to a state after the first to the third stages of the manufacturing process of the resistive element 1 of the first embodiment are performed. In the first manufacturing process, the oxide film 12, the polysilicon film 15, the protective oxide film 16, and the nitride film 17 are sequentially formed over the substrate 11, and over the nitride film 17, the belt-shaped resist patterns 18 having the first width W1 are formed so that the distance between the resist patterns 18 adjacent to each other is the second width W2. As shown in FIG. 21, the resist patterns 18 are formed over the resistive element first portion forming area 13 and the resistive element second portion forming area 14.

Figure 22:
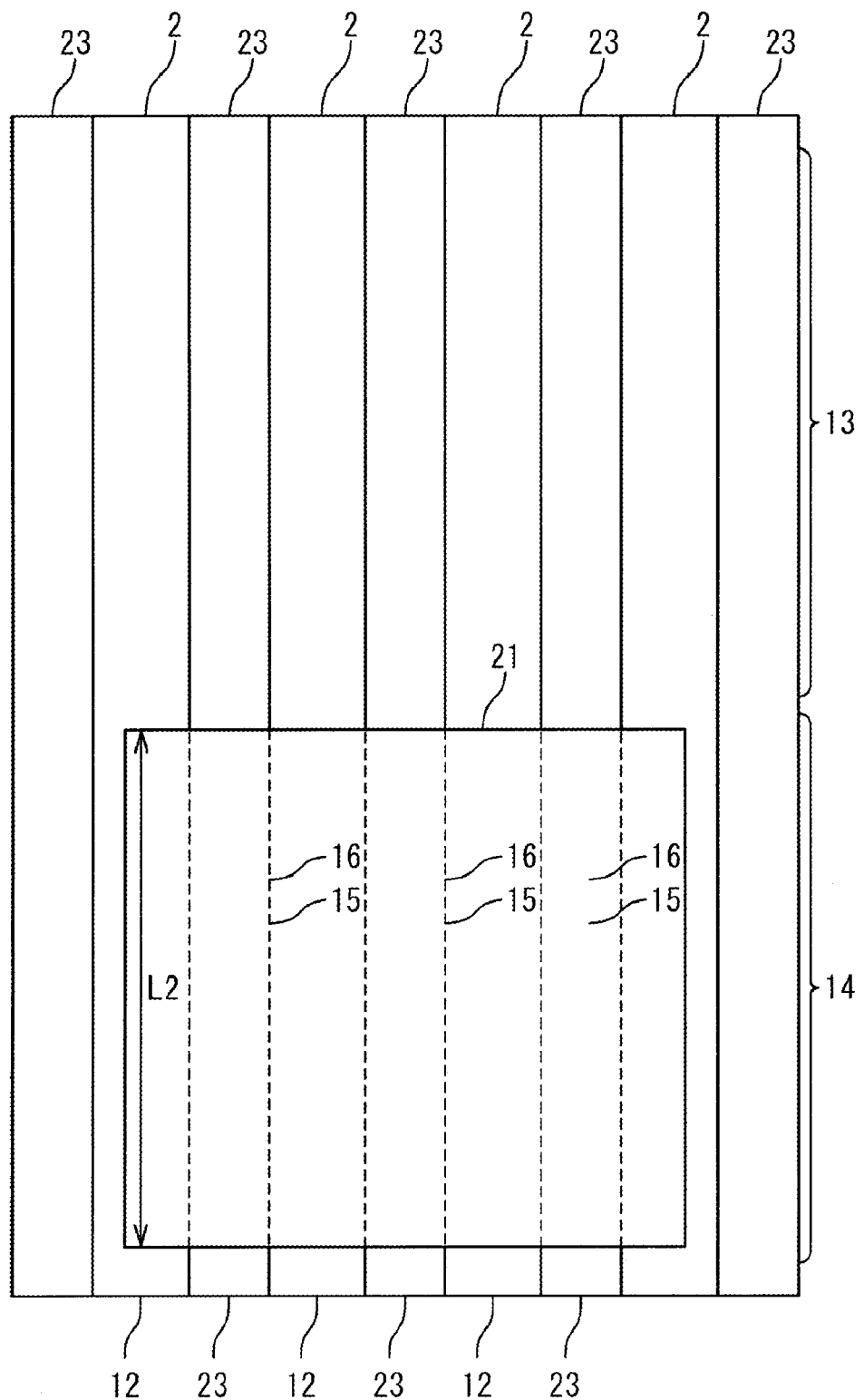
FIG. 22 is a plan view illustrating the state of the semiconductor material in a second manufacturing process of the resistive element of the second embodiment.

FIG. 22 is a plan view illustrating the state of the semiconductor material in a second manufacturing process of the resistive element 1 of the second embodiment. FIG. 22 corresponds to a state after the fourth to the seventh stages of the manufacturing process of the resistive element 1 of the first embodiment are performed. In the second manufacturing process, the surface of the protective oxide film 16 is partially exposed by selectively removing the nitride film 17 by performing anisotropic etching using the resist patterns 18 as a mask. Then, in the resistive element second portion forming area 14, the resistive element second portion area resist 21 is formed in an area in which the resistive element second portions 3 are formed in subsequent processes, and the protective oxide film 16 that is not covered by the resistive element second portion area resist 21 and the polysilicon film 15 below the protective oxide film 16 are selectively removed. As shown in FIG. 22, in the second manufacturing process, the oxide films 12 that are located between the nitride films 17 and not covered by the resistive element second portion area resist 21 are exposed.

Figure 23:
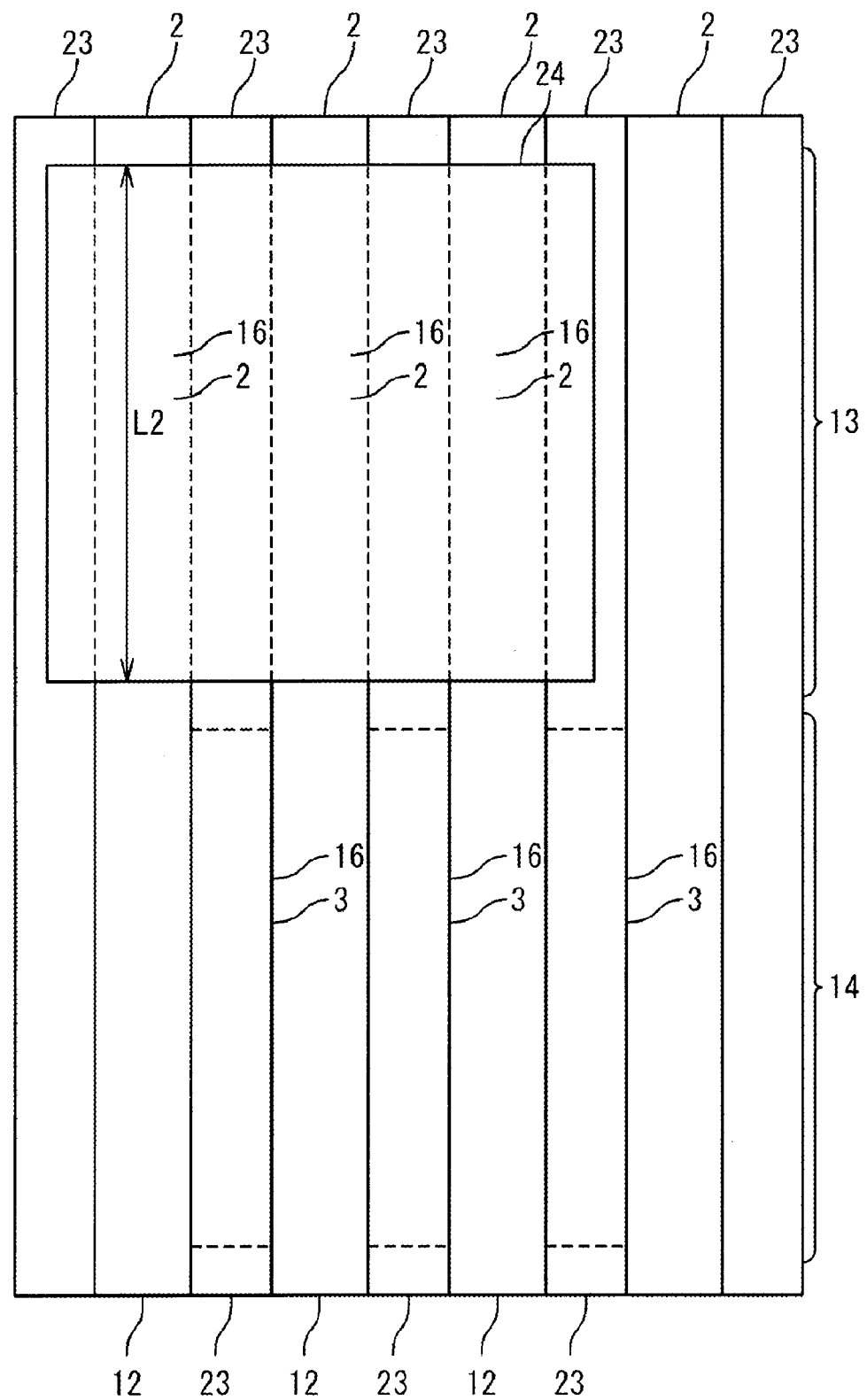
FIG. 23 is a plan view illustrating the state of the semiconductor material in a third manufacturing process of the resistive element of the second embodiment.

FIG. 23 is a plan view illustrating the state of the semiconductor material in a third manufacturing process of the resistive element 1 of the second embodiment. FIG. 23 corresponds to a state after the eighth to the twelfth stages of the manufacturing process of the resistive element 1 of the first embodiment are performed. In the third manufacturing process, the resistive element second portion area resist 21 formed in the resistive element second portion forming area 14 is removed. Then, the oxide film 23 is formed over the entire surface, and thereafter the oxide film 23 is flattened and the first opening portions 19 and the second opening portions 22 between the nitride films 17 are buried with the remaining oxide films 23. Thereafter, the nitride films 17 are removed and opening portions are formed in spaces in which the nitride films 17 were present between the oxide films 23. Then, in the resistive element first portion forming area 13, the resistive element first portion area resist 24 is formed in an area in which the resistive element first portions 2 are formed in subsequent processes, and the protective oxide film 16 that is not covered by the resistive element first portion area resist 24 and the polysilicon film 15 below the protective oxide film 16 are selectively removed by anisotropic etching. As shown in FIG. 23, in the third manufacturing process, the oxide films 12 that are located between the oxide films 23 and not covered by the resistive element first portion area resist 24 are exposed.

Figure 24:
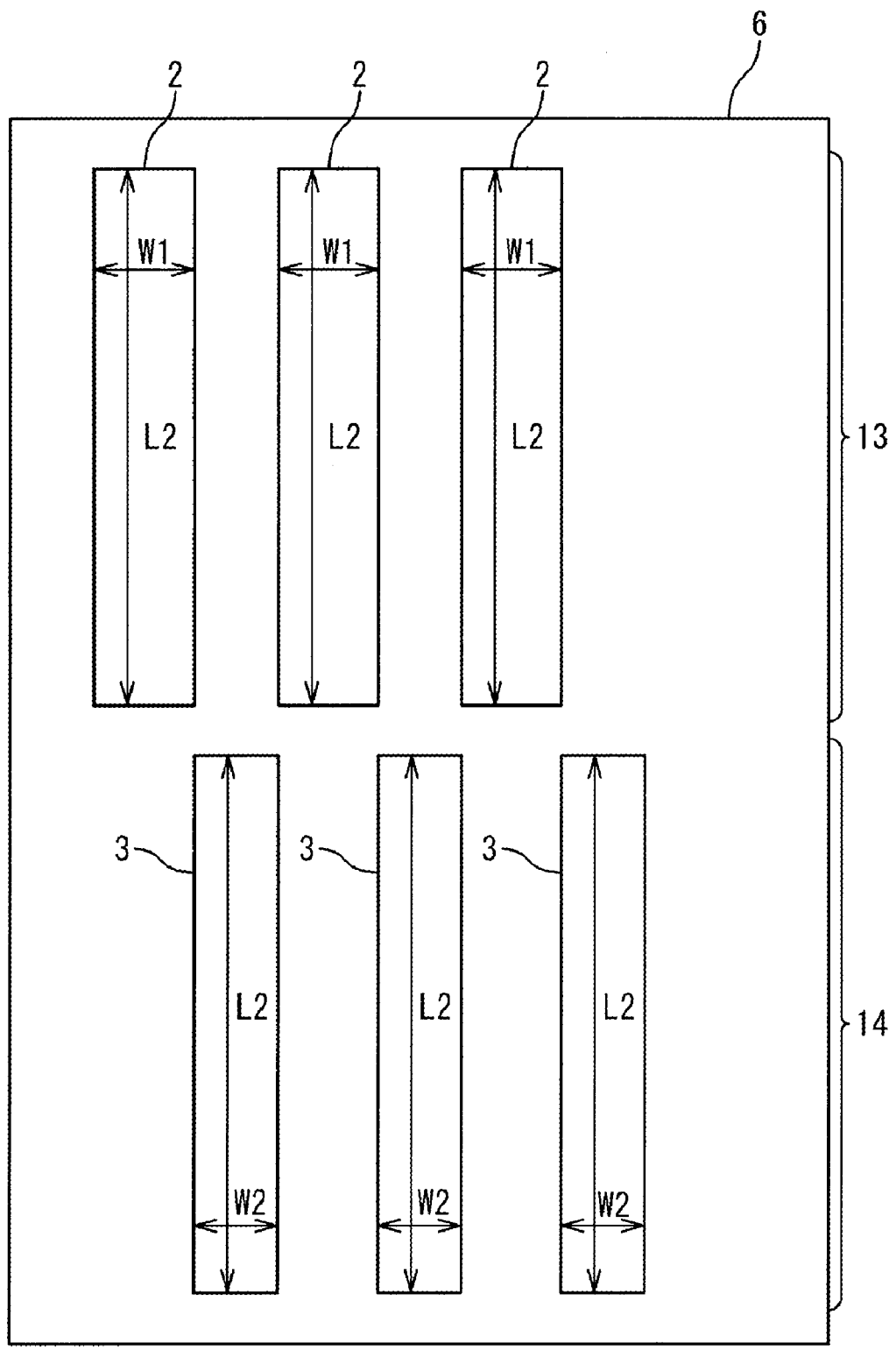
FIG. 24 is a plan view illustrating the state of the semiconductor material in a fourth manufacturing process of the resistive element of the second embodiment.

FIG. 24 is a plan view illustrating the state of the semiconductor material in a fourth manufacturing process of the resistive element 1 of the second embodiment. FIG. 24 corresponds to a state after the thirteenth stage of the manufacturing process of the resistive element 1 of the first embodiment is performed and before the contacts 4 are formed. In the fourth manufacturing process, the resistive element first portion area resist 24 is removed, and then the interlayer insulating film 6 including the protective oxide film 16 and the oxide film 23 covers the resistive element first portions 2 and the resistive element second portions 3. Thereafter, the resistive element first portions 2 are coupled with the resistive element second portions 3 via the contacts 4 and the coupling lines 5. In the second embodiment, the resistive element first portions 2 and the resistive element second portions 3 are located close to each other, so that the coupling lines can be short and simple even when the number of the resistors increases. As a result, it is possible to suppress the increase of the wiring area and provide a function as a high-precision resistive element 1.

Third Embodiment

Figure 25:
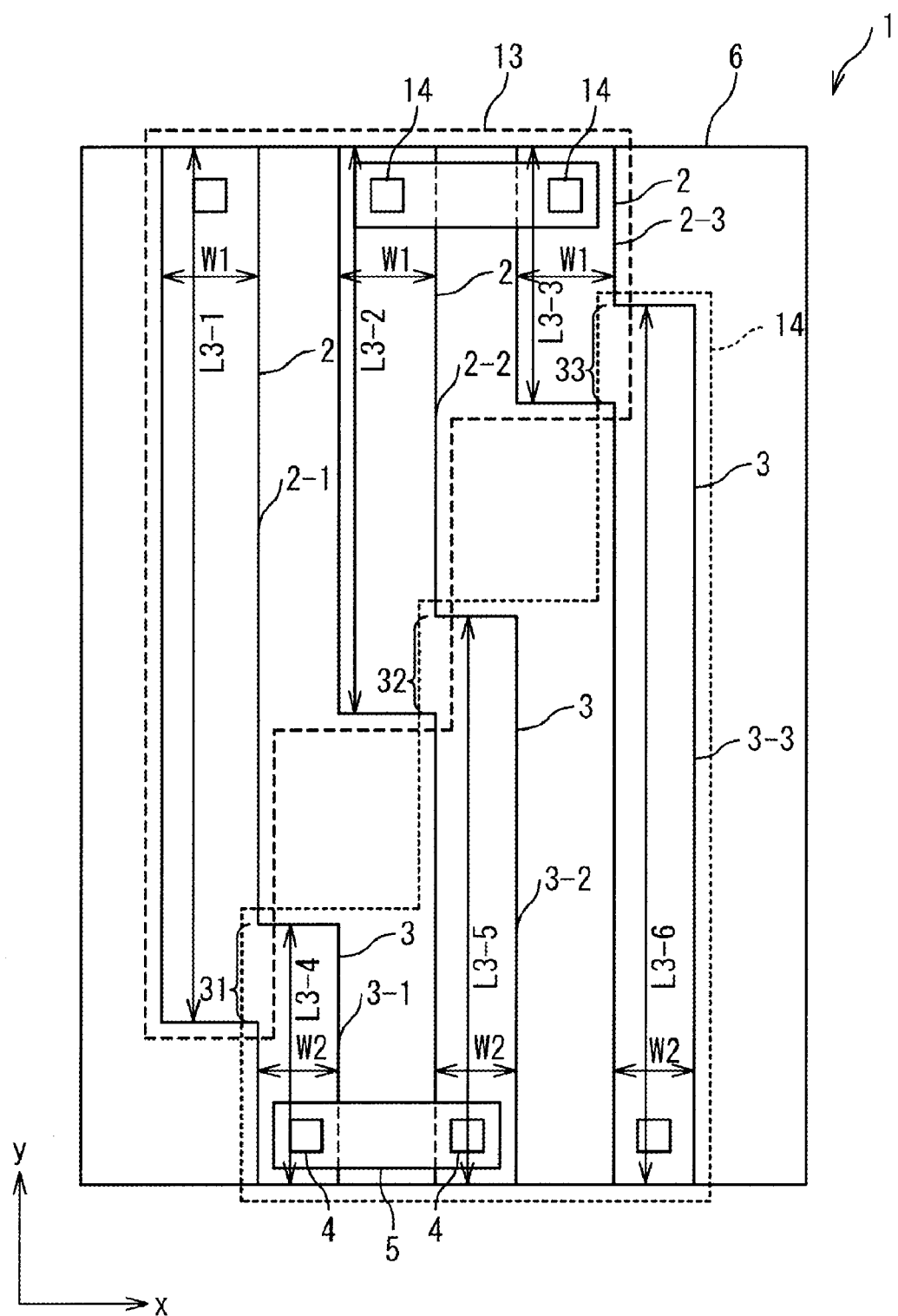
FIG. 25 is a plan view illustrating a configuration of a resistive element of a third embodiment.

Hereinafter, a third embodiment of the resistive element 1 of the present invention will be described. FIG. 25 is a plan view illustrating a configuration of the resistive element 1 of the third embodiment. In the resistive element 1 of the second embodiment described above, the resistive element first portions 2 disposed in the resistive element first portion forming area 13 and the resistive element second portions 3 disposed in the resistive element second portion forming area 14 are separated from each other in the y direction. The resistive element 1 of the third embodiment is formed in a shape in which parts of the resistive element first portions 2 are in contact with parts of the resistive element second portions 3. The resistive element 1 of the third embodiment is formed by combining multiple resistive element first portions 2 having different lengths and multiple resistive element second portions 3 having different lengths. In the third embodiment described below, the resistive element 1 which includes three resistive element first portions 2 having different lengths and three resistive element second portions 3 having different lengths and in which the resistive element first portions 2 and the resistive element second portions 3 are coupled in series will be illustrated. This configuration is used to easily understand the resistive element 1 of the present embodiment, and this configuration does not limit the number and coupling of the resistive element first portions 2 and the resistive element second portions 3 in the resistive element 1.

FIG. 25 indicates that, in the resistive element 1 of the third embodiment, the resistive element first portions 2 includes a resistive element first portion 2-1 having a first length L3-1, a resistive element first portion 2-2 having a second length L3-2, and a resistive element first portion 2-3 having a third length L3-3. Also, in the resistive element 1, the resistive element second portions 3 includes a resistive element second portion 3-1 having a fourth length L3-4, a resistive element second portion 3-2 having a fifth length L3-5, and a resistive element second portion 3-3 having a sixth length L3-6. The resistive element 1 of the third embodiment is formed so that the lengths of resistance components are defined as the first length L3-1=the sixth length L3-6, the second length L3-2=the fifth length L3-5, and the third length L3-3=the fourth length L3-4.

In the resistive element 1 of the third embodiment, the resistive element first portion 2-1 is coupled with the resistive element second portion 3-1 via a coupling area 31. The resistive element first portion 2-2 is coupled with the resistive element second portion 3-2 via a coupling area 32. The resistive element first portion 2-3 is coupled with the resistive element second portion 3-3 via a coupling area 33. The resistive element 1 is formed so that the area of a cross-section of the coupling area 31 taken along a plane perpendicular to the x-y plane, the area of a cross-section of the coupling area 32 taken along a plane perpendicular to the x-y plane, and the area of a cross-section of the coupling area 33 taken along a plane perpendicular to the x-y plane are substantially the same.

Figure 26:
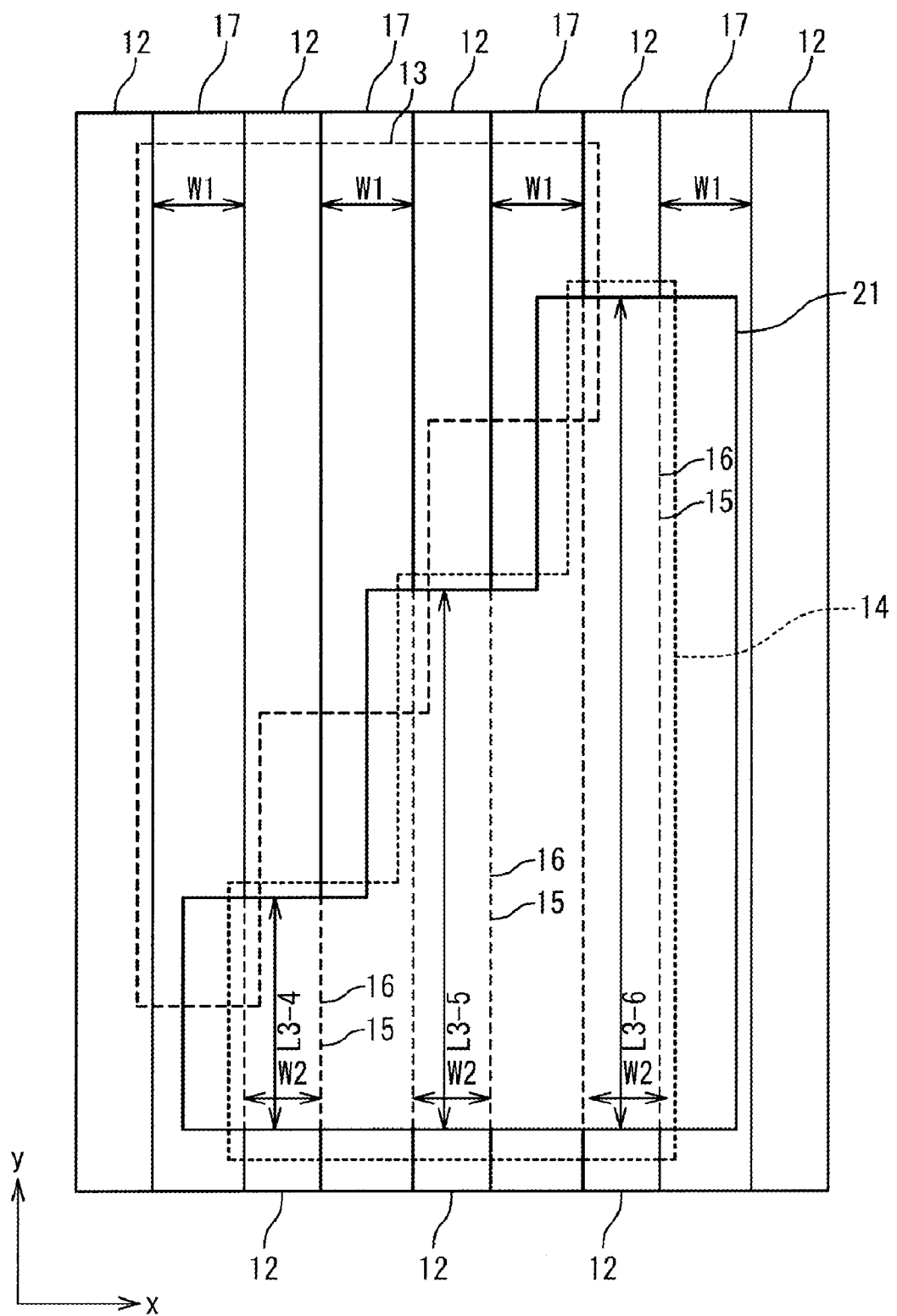
FIG. 26 is a plan view illustrating a state of a semiconductor material in a first manufacturing process of the resistive element of the third embodiment.

FIG. 26 is a plan view illustrating a state of a semiconductor material in a first manufacturing process of the resistive element 1 of the third embodiment. FIG. 26 corresponds to a state after the first to the seventh stages of the manufacturing process of the resistive element 1 of the first embodiment are performed. In the first manufacturing process, the oxide film 12, the polysilicon film 15, the protective oxide film 16, and the nitride film 17 are sequentially formed over the substrate 11, and over the nitride film 17, the belt-shaped resist patterns 18 having the first width W1 are formed so that the distance between the resist patterns 18 adjacent to each other is the second width W2. Thereafter, the surface of the protective oxide film 16 is partially exposed by selectively removing the nitride film 17 by performing anisotropic etching using the resist patterns 18 as a mask.

Then, in the resistive element second portion forming area 14, the resistive element second portion area resist 21 is formed in an area in which the resistive element second portions 3 are formed in subsequent processes, and the protective oxide film 16 that is not covered by the resistive element second portion area resist 21 and the polysilicon film 15 below the protective oxide film 16 are selectively removed. As shown in FIG. 26, in the resistive element second portion area resist 21, the length of the area in which the resistive element second portion 3-1 is formed in subsequent processes is the fourth length L3-4, the length of the area in which the resistive element second portion 3-2 is formed in subsequent processes is the fifth length L3-5, and the length of the area in which the resistive element second portion 3-3 is formed in subsequent processes is the sixth length L3-6. In the first manufacturing process, the oxide films 12 that are located between the nitride films 17 and not covered by the resistive element second portion area resist 21 are exposed.

Figure 27:
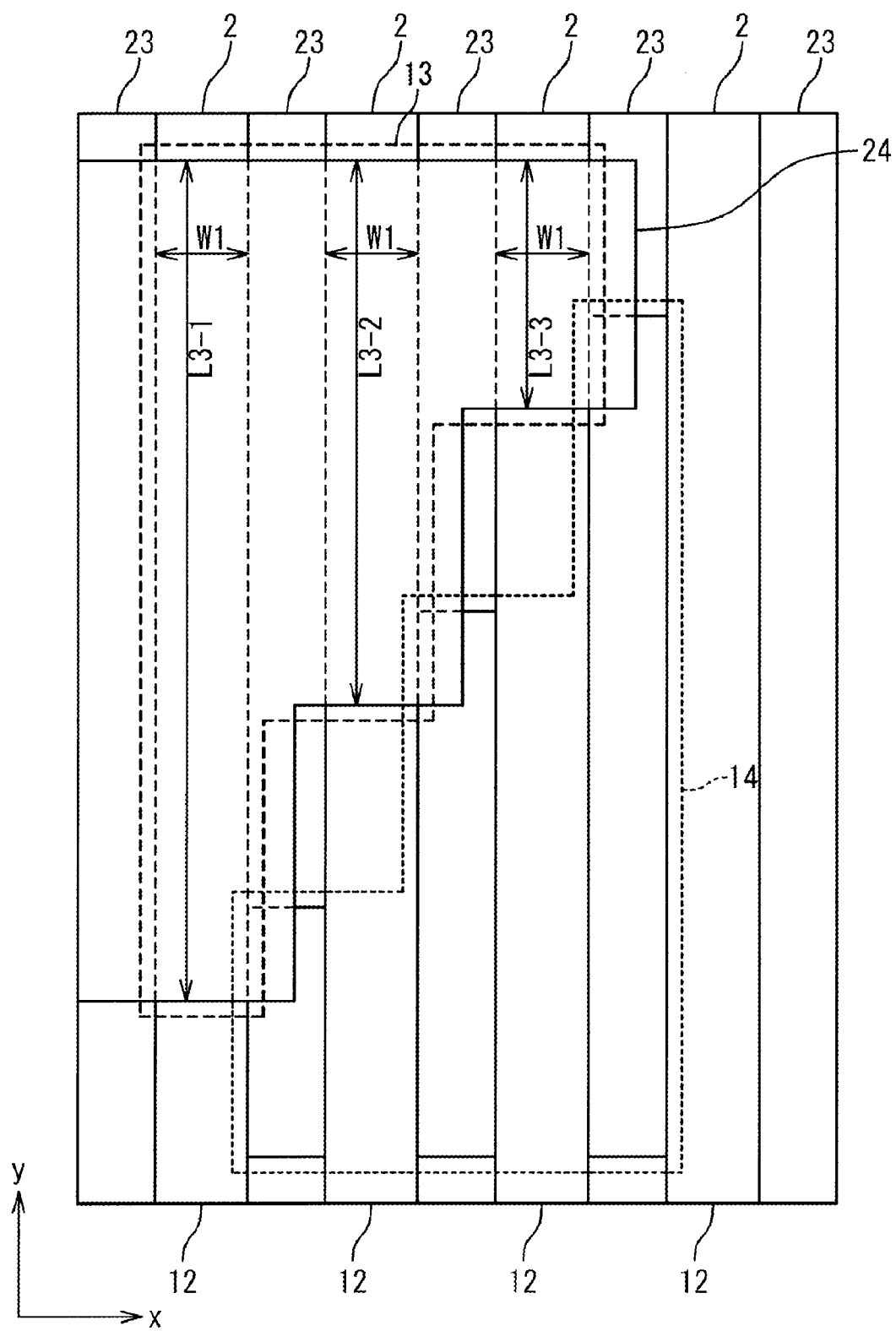
FIG. 27 is a plan view illustrating the state of the semiconductor material in a second manufacturing process of the resistive element of the third embodiment.

FIG. 27 is a plan view illustrating the state of the semiconductor material in a second manufacturing process of the resistive element 1 of the third embodiment. FIG. 27 corresponds to a state after the eighth to the twelfth stages of the manufacturing process of the resistive element 1 of the first embodiment are performed. In the second manufacturing process, the resistive element second portion area resist 21 formed in the resistive element second portion forming area 14 is removed. Then, the oxide film 23 is formed over the entire surface, and thereafter the oxide film 23 is flattened and the first opening portions 19 and the second opening portions 22 between the nitride films 17 are buried with the remaining oxide film 23. Thereafter, the nitride films 17 are removed and opening portions are formed in spaces in which the nitride films 17 were present between the oxide films 23.

Then, in the resistive element first portion forming area 13, the resistive element first portion area resist 24 is formed in an area in which the resistive element first portions 2 are formed in subsequent processes, and the protective oxide film 16 that is not covered by the resistive element first portion area resist 24 and the polysilicon film 15 below the protective oxide film 16 are selectively removed by anisotropic etching. As shown in FIG. 27, in the resistive element first portion area resist 24, the length of the area in which the resistive element first portion 2-1 is formed in subsequent processes is the first length L3-1, the length of the area in which the resistive element first portion 2-2 is formed in subsequent processes is the second length L3-2, and the length of the area in which the resistive element first portion 3-3 is formed in subsequent processes is the third length L3-3. In the third manufacturing process, the oxide films 12 that are located between the oxide films 23 and not covered by the resistive element first portion area resist 24 are exposed.

Figure 28:
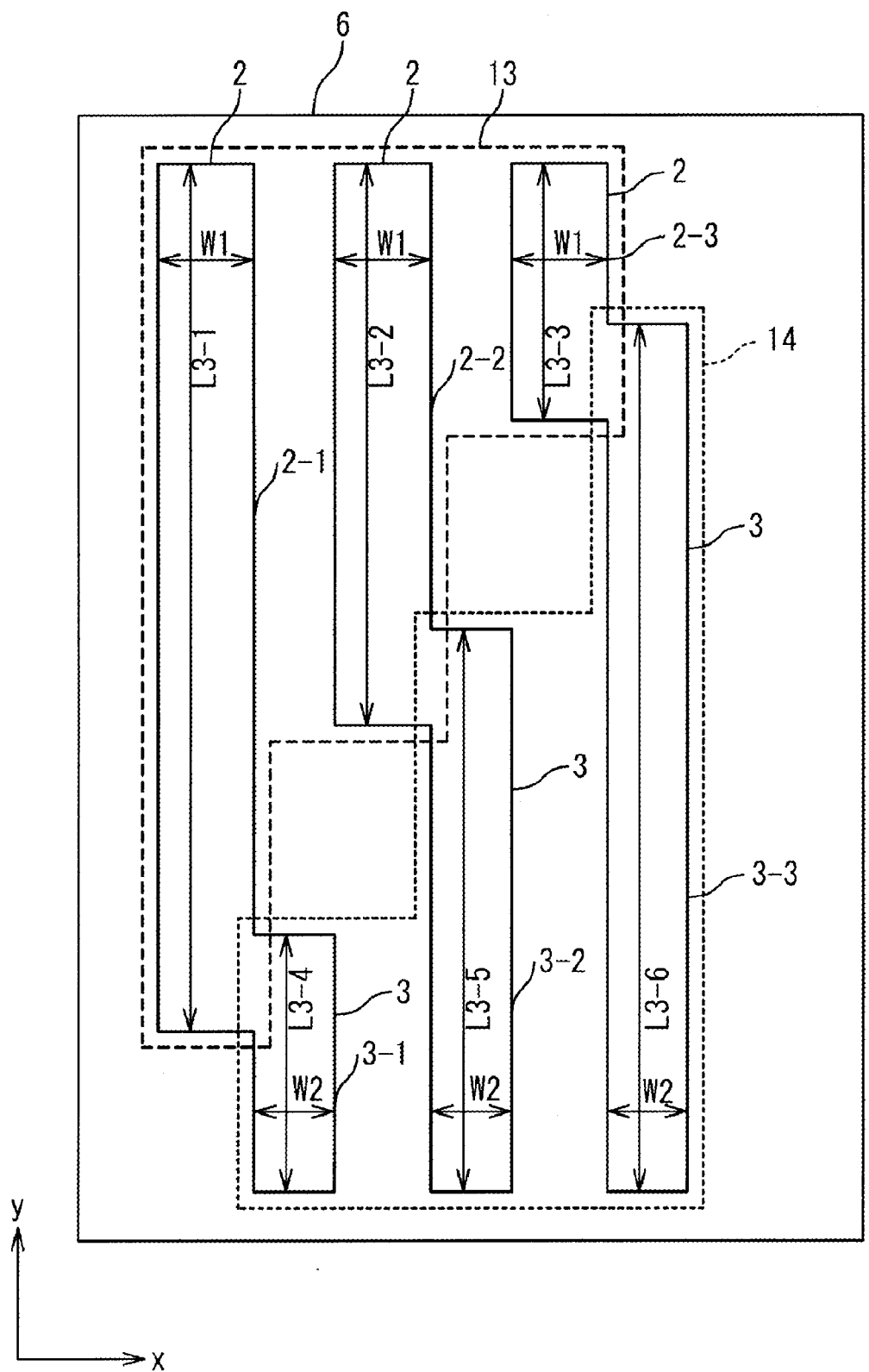
FIG. 28 is a plan view illustrating the state of the semiconductor material in a third manufacturing process of the resistive element of the third embodiment.

FIG. 28 is a plan view illustrating the state of the semiconductor material in a third manufacturing process of the resistive element 1 of the third embodiment. FIG. 28 corresponds to a state after the thirteenth stage of the manufacturing process of the resistive element 1 of the first embodiment is performed and before the contacts 4 are formed. In the third manufacturing process, the resistive element first portion area resist 24 is removed, and then the interlayer insulating film 6 including the protective oxide film 16 and the oxide film 23 covers the resistive element first portions 2 and the resistive element second portions 3. Thereafter, the resistive element first portion 2-2 is coupled with the resistive element first portion 2-3 via the contacts 4 and the coupling line 5 and the resistive element second portion 3-1 is coupled with the resistive element second portion 3-2. In the resistive element 1 of the third embodiment, the resistive element first portions 2 are in contact with the resistive element second portions 3, so that the coupling lines in the central portion of the resistor area are not required, and for example, the resistive element 1 can be used as a line passing through area of a power supply line which is required by a circuit. Further, a space which separates the resistive element first portions 2 and the resistive element second portions 3 from each other is not required, so that it is possible to suppress the increase of the area of the resistive element and provide a function as a high-precision resistive element 1.

The embodiments of the present invention have been specifically described. The present invention is not limited to the embodiments described above, and various modifications are possible without departing from the scope and spirit of the invention. The multiple embodiments described above can be combined to provide other embodiments unless the configuration and the operation thereof are inconsistent.

What is claimed is:

1. A resistive element comprising:
a resistive element first portion which is formed with a first film thickness and has a first width; and
a resistive element second portion which is formed with the first film thickness and has a second width that is determined depending on the first width,
wherein a sum of the first width and the second width is constant,
wherein the resistive element first portion has an upper surface of the resistive element first portion at a position at which a height from a bottom surface of the resistive element first portion is a first height,
wherein the resistive element second portion has an upper surface of the resistive element second portion at a position at which a height from a surface including the bottom surface of the resistive element first portion is the first height, and
wherein the resistive element first portion and the resistive element second portion are coupled to each other via a coupling portion.

2. The resistive element according to claim 1,
wherein the resistive element second portion is disposed without being sandwiched between the resistive element first portion and another resistive element first portion disposed adjacent to the resistive element first portion.

3. The resistive element according to claim 2, further comprising:
another resistive element second portion disposed adjacent to the resistive element second portion,
wherein a first member in which the resistive element first portion and the resistive element second portion are coupled to each other is coupled to a second member in which the other resistive element first portion and the other resistive element second portion are coupled to each other.

4. The resistive element according to claim 2,
wherein the first width corresponds to a width of a resist pattern patterned when the resistive element first portion is formed, and
wherein the second width corresponds to a distance between the resist pattern and another resist pattern patterned when the other resistive element first portion is formed.

5. The resistive element according to claim 3,
wherein, when a direction in which the resistive element first portion and the other resistive element first portion are disposed is defined as a first direction,
wherein the resistive element first portion is formed in a portion of a first belt-shaped area extending along a second direction crossing the first direction,
wherein the other resistive element first portion is formed in a portion of another first belt-shaped area provided through an insulating area adjacent to the first belt-shaped area, and
wherein the resistive element second portion is disposed in a portion of a second belt-shaped area extended from the insulating area without overlapping the resistive element first portion and the other resistive element first portion.

6. The resistive element according to claim 5,
wherein the upper surface of the resistive element first portion has a first long side which is in parallel with the second direction crossing the first direction and located in a position far from the second belt-shaped area and a second long side opposite to the first long side,
wherein the upper surface of the resistive element second portion has a third long side which is in parallel with the second direction and located in a position near the first belt-shaped area and a fourth long side which is located in a position opposite to the third long side and near the other first belt-shaped area, and
wherein a straight line including the third long side of the resistive element second portion includes the second long side of the resistive element first portion.

7. The resistive element according to claim 6,
wherein the resistive element first portion and the resistive element second portion respectively have side surfaces, and
wherein a part of the side surface of the resistive element first portion is in contact with a part of the side surface of the resistive element second portion via a contact portion.

8. A method of manufacturing a resistive element, the method comprising the steps of:
(a) determining a first portion disposition planned area in which a resistive element first portion having a first width is provided and a second portion disposition planned area in which a resistive element second portion having a second width is provided,
(b) forming an electric conductive film having a first film thickness over a first insulating film formed over a substrate,
(c) forming a second insulating film having a trench-shaped first opening portion over the electric conductive film in the first portion disposition planned area and the electric conductive film in the second portion disposition planned area,
(d) forming a second opening portion in the electric conductive film by covering the second portion disposition planned area with a first resist and selectively etching the electric conductive film in the first portion disposition planned area using the second insulating film that is not covered by the first resist as a mask,
(e) removing the first resist, thereafter burying the first opening portion and the second opening portion with a third insulating film having an etching rate different from that of the second insulating film, and thereafter removing the second insulating film,
(f) covering the third insulating film and the electric conductive film in the first portion disposition planned area with a second resist, and
(g) forming a third opening portion in the electric conductive film by selectively etching the electric conductive film using the third insulating film that is not covered by the second resist as a mask.

9. The method of manufacturing a resistive element according to claim 8, wherein
wherein the step (c) includes forming a resist pattern including a trench having the second width over the second insulating film and forming the first opening portion according to the resist pattern,
wherein the step (d) includes forming the second opening portion having the second width below the first opening portion,
wherein the step (e) includes forming the third insulating film including an opening portion having the first width by removing the second insulating film, and wherein the step (g) includes forming the third opening portion having the first width using the third insulating film including the opening portion having the first width as a mask.

10. The method of manufacturing a resistive element according to claim 8,
   wherein the step (d) includes forming the resistive element first portion in a portion of a first belt-shaped area extending along the second opening portion, and forming another resistive element first portion in a portion of another first belt-shaped area provided through the second opening portion adjacent to the first belt-shaped area, and
   wherein the step (g) includes forming the resistive element second portion in a portion of a second belt-shaped area extended from the second opening portion.

11. The method of manufacturing a resistive element according to claim 10,
   wherein the step (d) includes covering the second portion disposition planned area with the first resist and covering a part of the first portion disposition planned area with the first resist, and
   wherein the step (f) includes covering the first portion disposition planned area with the second resist and covering a part of the second portion disposition planned area with the second resist.

12. The method of manufacturing a resistive element according to claim 11,
   wherein the step (d) includes covering a portion of the first belt-shaped area with the first resist having a first length and covering a portion of the other first belt-shaped area with the first resist having a second length,
   wherein the step (f) includes covering a portion of the second belt-shaped area with the second resist having a third length and covering another second belt-shaped area provided in the second belt-shaped area through the other first belt-shaped area with the second resist having a fourth length,
   wherein the first length is equal to the fourth length, and
   wherein the second length is equal to the third length.

13. The method of manufacturing a resistive element according to claim 8, further comprising the steps of:
   (h) covering the resistive element first portion and the resistive element second portion with an interlayer insulating film after removing the second resist, and
   (i) coupling the resistive element first portion and the resistive element second portion to each other via a contact formed in the interlayer insulating film and a line coupled to the contact.

14. The resistive element according to claim 3,
   wherein the first width corresponds to a width of a resist pattern patterned when the resistive element first portion is formed, and
   wherein the second width corresponds to a distance between the resist pattern and another resist pattern patterned when the other resistive element first portion is formed.

15. The resistive element according to claim 4,
   wherein, when a direction in which the resistive element first portion and the other resistive element first portion are disposed is defined as a first direction,
   wherein the resistive element first portion is formed in a portion of a first belt-shaped area extending along a second direction crossing the first direction,
   wherein the other resistive element first portion is formed in a portion of another first belt-shaped area provided through an insulating area adjacent to the first belt-shaped area, and
   wherein the resistive element second portion is disposed in a portion of a second belt-shaped area extended from the insulating area without overlapping the resistive element first portion and the other resistive element first portion.

16. The method of manufacturing a resistive element according to claim 9,
   wherein the step (d) includes forming the resistive element first portion in a portion of a first belt-shaped area extending along the second opening portion, and forming another resistive element first portion in a portion of another first belt-shaped area provided through the second opening portion adjacent to the first belt-shaped area, and
   wherein the step (g) includes forming the resistive element second portion in a portion of a second belt-shaped area extended from the second opening portion.

17. The method of manufacturing a resistive element according to claim 9, further comprising the steps of:
   (h) covering the resistive element first portion and the resistive element second portion with an interlayer insulating film after removing the second resist, and
   (i) coupling the resistive element first portion and the resistive element second portion to each other via a contact formed in the interlayer insulating film and a line coupled to the contact.

18. The method of manufacturing a resistive element according to claim 10, further comprising the steps of:
   (h) covering the resistive element first portion and the resistive element second portion with an interlayer insulating film after removing the second resist, and
   (i) coupling the resistive element first portion and the resistive element second portion to each other via a contact formed in the interlayer insulating film and a line coupled to the contact.

19. The method of manufacturing a resistive element according to claim 11, further comprising the steps of:
   (h) covering the resistive element first portion and the resistive element second portion with an interlayer insulating film after removing the second resist, and
   (i) coupling the resistive element first portion and the resistive element second portion to each other via a contact formed in the interlayer insulating film and a line coupled to the contact.

20. The method of manufacturing a resistive element according to claim 12, further comprising the steps of:
   (h) covering the resistive element first portion and the resistive element second portion with an interlayer insulating film after removing the second resist, and
   (i) coupling the resistive element first portion and the resistive element second portion to each other via a contact formed in the interlayer insulating film and a line coupled to the contact.

* * * * *